United States Patent
Sorada et al.

(10) Patent No.: US 7,473,967 B2
(45) Date of Patent: Jan. 6, 2009

(54) STRAINED CHANNEL FINFET DEVICE

(75) Inventors: Haruyuki Sorada, Hirakata (JP);
Takeshi Takagi, Kyoto (JP); Akira Asai, Osaka (JP); Yoshihiko Kanzawa, Yawata (JP); Kouji Katayama, Nara (JP); Junko Iwanaga, Shijonawata (JP)

(73) Assignee: Panasonic Corporation, Osaka (JP)

( * ) Notice: Subject to any disclaimer, the term of this patent is extended or adjusted under 35 U.S.C. 154(b) by 340 days.

(21) Appl. No.: 10/558,671

(22) PCT Filed: May 31, 2004

(86) PCT No.: PCT/JP2004/007872

§ 371 (c)(1),
(2), (4) Date: Nov. 30, 2005

(87) PCT Pub. No.: WO2004/107452

PCT Pub. Date: Dec. 9, 2004

(65) Prior Publication Data

US 2007/0052041 A1 Mar. 8, 2007

(30) Foreign Application Priority Data

May 30, 2003 (JP) .............................. 2003-155043

(51) Int. Cl.
*H01L 27/088* (2006.01)
(52) U.S. Cl. ............... 257/347; 257/401; 257/E21.014; 438/157
(58) Field of Classification Search ......... 257/410–413, 257/347, E21.014; 438/157, 197, 199
See application file for complete search history.

(56) References Cited

U.S. PATENT DOCUMENTS 4,996,574 A 2/1991 Shirasaki
(Continued)

FOREIGN PATENT DOCUMENTS

EP 0 587 520 A1 3/1994
(Continued)

OTHER PUBLICATIONS

European Search Report issued in corresponding European Patent Application No. 04 73 5510, dated Mar. 2, 2007.
(Continued)

*Primary Examiner*—Thao X Le
*Assistant Examiner*—William F Kraig
(74) *Attorney, Agent, or Firm*—McDermott Will & Emery LLP

(57) ABSTRACT

A semiconductor device according to this invention includes: a first insulating layer (11); a first body section (13) including an island-shaped semiconductor formed on the first insulating layer; a second body section (14) including an island-shaped semiconductor formed on the first insulating layer; a ridge-shaped connecting section (15) formed on the first insulating layer to interconnect the first body section and the second body section; a channel region (15a) formed by at least a part of the connecting section in lengthwise direction of the connecting section; a gate electrode (18) formed to cover a periphery of the channel region, with a second insulating layer intervening therebetween; a source region formed to extend over the first body section and a portion of the connecting section between the first body section and the channel region; and a drain region formed to extend over the second body section and a portion of the connecting section between the second body section and the channel region, wherein a semiconductor forming the channel region has a lattice strain.

4 Claims, 18 Drawing Sheets

U.S. PATENT DOCUMENTS

| | | | |
|---|---|---|---|
| 6,458,662 B1 | 10/2002 | Bin | |
| 6,475,869 B1 | 11/2002 | Yu | |
| 6,713,779 B2 | 3/2004 | Tezuka et al. | |
| 6,727,550 B2 | 4/2004 | Tezuka et al. | |
| 6,774,390 B2* | 8/2004 | Sugiyama et al. | 257/19 |
| 6,800,910 B2* | 10/2004 | Lin et al. | 257/410 |
| 6,803,631 B2* | 10/2004 | Dakshina-Murthy et al. | 257/349 |
| 6,921,982 B2* | 7/2005 | Joshi et al. | 257/349 |
| 6,943,407 B2* | 9/2005 | Ouyang et al. | 257/329 |
| 6,972,461 B1* | 12/2005 | Chen et al. | 257/347 |
| 7,045,401 B2* | 5/2006 | Lee et al. | 438/157 |
| 7,129,517 B2* | 10/2006 | Yang | 257/20 |
| 7,154,118 B2* | 12/2006 | Lindert et al. | 257/66 |
| 7,279,735 B1* | 10/2007 | Yu et al. | 257/315 |
| 2003/0006461 A1 | 1/2003 | Tsutomu et al. | |
| 2003/0227036 A1 | 12/2003 | Sugiyama et al. | |
| 2004/0108559 A1 | 6/2004 | Sugii et al. | |
| 2004/0185626 A1 | 9/2004 | Jeong-Hwan | |
| 2004/0195624 A1* | 10/2004 | Liu et al. | 257/347 |
| 2004/0256647 A1* | 12/2004 | Lee et al. | 257/289 |

FOREIGN PATENT DOCUMENTS

| | | | |
|---|---|---|---|
| JP | 02-014578 | | 1/1990 |
| JP | 2001-298194 | | 10/2001 |
| JP | 2002-57329 | | 2/2002 |
| JP | 2002-280568 | | 9/2002 |
| JP | 2003-023160 | | 1/2003 |
| JP | 2003-243667 | | 8/2003 |
| JP | 2004-128185 | | 4/2004 |
| KR | 2005-0065908 | * | 6/2005 |
| WO | WO 03/081640 A2 | | 10/2003 |
| WO | WO 2004/032246 A1 | | 4/2004 |
| WO | WO 2004/068585 A1 | | 8/2004 |
| WO | WO 2004/068589 A1 | | 8/2004 |
| WO | WO 2004/073044 A2 | | 8/2004 |

OTHER PUBLICATIONS

Liu et al., "A Novel Sidewall Strained-Si Channel nMOSFET," Electronic Devices Meeting, Dec. 5-8, 1999, pp. 63-66, IEDM Technical Digest, Piscataway, NJ.

* cited by examiner

STRAINED CHANNEL FINFET DEVICE

This application is the U.S. National Phase under 35 U.S.C. § 371 of International Application No. PCT/JP2004/007872, filed May 31, 2004, which in turn claims the benefit of Japanese Application No. 2003-155043, May 30, 2003, the disclosures of which Applications are incorporated by reference herein in their entirety.

TECHNICAL FIELD

The present invention relates to a semiconductor device and a method of fabricating the same and, more particularly, to a semiconductor device comprising a fin FET including a semiconductor layer having lattice strain and a method of fabricating such a semiconductor device.

BACKGROUND ART

With the trend toward a ubiquitous network and wearable mobile equipment, the market is strongly demanding that LSIs and memory devices exhibit higher speed operation, higher integration and lower power consumption. According to the International Technology Roadmap for Semiconductors (ITRS2001), alternation of design rule generations will be accelerated and, as well, introduction of new materials and structures will start being accelerated at a node below approximately 65 nm node. One of the causes of such acceleration is that it has become more difficult to obtain satisfactory current driving ability than before due to source voltage scaling, deterioration of carrier mobility and the like. In attempt to solve these problems, proposals have been made of a device in which a new material having a high carrier mobility such as strained silicon or silicon-germanium (SiGe) is introduced to form a channel (see J. L. Hoyt and seven others, "Strained Silicon MOSFET Technology", International Electron Device Meeting (IEDM) 2002, P23-26 for example) and of a device having a three-dimensional channel structure such as a fin FET (Fin Field Effect transistor (trigate)) or a double gate device (see Japanese Patent Publication No. 2768719 for example).

Silicon-germanium has a higher carrier (hole) mobility than silicon. For this reason, the use of silicon-germanium for the p-channel of a field effect transistor makes it possible to realize a higher speed operation. On the other hand, strained silicon is higher in both electron mobility and hole mobility than silicon having no lattice strain. Accordingly, the use of strained silicon for both of n- and p-channels of field effect transistors makes it possible to improve the performance of the transistors, hence, realize a higher speed operation without relying upon miniaturization. However, under acceleration of miniaturization it becomes very difficult for such conventional transistor structures to suppress the short channel effect.

The short channel effect is a phenomenon which becomes conspicuous when the drain becomes more dominant over the channel than the gate (specifically, when a depletion layer extending from the drain exerts an influence upon the formation of the channel) and which causes fluctuations in the threshold value of the transistor and an increase in leakage current to occur. Each of the transistors called the fin FET and the double gate transistor, which have been proposed in attempt to overcome this problem, has a structure wherein the channel is three-dimensionally surrounded by the gate to enhance the dominance of the gate over the channel. Accordingly, the channel is applied with the gate voltage from at least two directions whereby the short channel effect can be suppressed effectively. At the same time, such a transistor has a gate-surrounded channel area two to three times as large as that of a full depletion type device having a two-dimensional (planar) gate structure per unit device area and hence has increased current driving ability. However, because such a proposed device has the channel formed of conventional silicon, the challenge to improve the driving ability from the viewpoint of deterioration of carrier mobility is left unsolved.

DISCLOSURE OF INVENTION

An object of the present invention is to provide a semiconductor device having a high current driving ability even at a low voltage and suited to miniaturization, as well as a method of fabricating the same.

With a view to attaining this object, a semiconductor device according to the present invention includes: a first insulating layer; a first body section comprising an island-shaped semiconductor formed on the first insulating layer; a second body section comprising an island-shaped semiconductor formed on the first insulating layer; a ridge-shaped connecting section formed on the first insulating layer to interconnect the first body section and the second body section; a channel region formed by at least a part of the connecting section in lengthwise direction of the connecting section; a gate electrode formed to cover a periphery of the channel region, with a second insulating layer intervening therebetween; a source region formed to extend over the first body section and a portion of the connecting section between the first body section and the channel region; and a drain region formed to extend over the second body section and a portion of the connecting section between the second body section and the channel region, wherein a semiconductor forming the channel region has a lattice strain.

With this construction, since the semiconductor forming the channel region has a lattice strain, the channel region forms a channel having a high carrier mobility and, hence, the semiconductor device has an improved current driving ability. Further, since the gate electrode is formed to three-dimensionally cover the ridge-shaped channel region having a lattice strain, the dominance of the gate over the channel is enhanced, which results in an improved short-channel effect immunity. Additionally, the semiconductor device has a current-voltage characteristic with a steep rise (subthreshold slope) and hence can obtain a high current value at a low voltage. This means that it is possible to obtain a semiconductor device having a high current driving ability even at a low voltage and highly suited to miniaturization.

The semiconductor forming the channel region may comprise a first semiconductor, and a second semiconductor forming a heterojunction with the first semiconductor and having a smaller lattice constant than the first semiconductor, the second semiconductor having a lattice strain.

It is possible that the first semiconductor is silicon-germanium and the second semiconductor is silicon. With this feature, the strained silicon for forming the channel is high in both electron mobility and hole mobility, which makes it possible to enhance the current driving ability. If a CMOS (complementary transistor) is constructed comprising an n-channel transistor and a p-channel transistor which are each formed by using the semiconductor device according to the present invention, the resulting CMOS can have high integration and is capable of high-speed operation at a low voltage.

Preferably, the second semiconductor has a lattice strain of not less than 0.8% and not more than 5.0%.

More preferably, the second semiconductor has a lattice strain of not less than 1.6% and not more than 4.2%.

It is possible that: a first relaxed semiconductor layer comprising the first semiconductor of which lattice is relaxed is formed on the first insulating layer; and a first strained semiconductor layer comprising the second semiconductor epitaxially grown is formed over side and top surfaces of the first relaxed semiconductor layer.

Preferably, the first semiconductor has a germanium concentration of not less than 10% and not more than 60%.

More preferably, the first semiconductor has a germanium concentration of not less than 20% and not more than 50%.

It is possible that: a second relaxed semiconductor layer comprising the second semiconductor of which lattice is relaxed is formed on the first insulating layer; a second strained semiconductor layer comprising the first semiconductor epitaxially grown is formed on the second relaxed semiconductor layer; and a partially strained semiconductor layer comprising the second semiconductor epitaxially grown is formed over side and top surfaces of a stacked structure comprising the second relaxed semiconductor layer and the second strained semiconductor layer.

Preferably, the second strained semiconductor layer has a germanium concentration of not less than 5% and not more than 15% when the channel region is configured to form an n-channel, and a germanium concentration of not less than 5% and not more than 30% when the channel region is configured to form a p-channel.

Preferably, the connecting section has a rectangular profile and has a height-to-width ratio of not less than 1 and not more than 100 when the channel region is configured to form an n-channel, and a height-to-width ratio of not less than 1 and not more than 1000 when the channel region is configured to form a p-channel.

More preferably, the connecting section has a height-to-width ratio of not less than 1.1 and not more than 30.45 when the channel region is configured to form an n-channel, and a height-to-width ratio of not less than 1.15 and not more than 25.45 when the channel region is configured to form a p-channel.

It is possible that the connecting section has a rectangular profile and a side surface of the connecting section is plane (100).

A method of fabricating a semiconductor device according to the present invention includes the steps of: (A) forming on a first insulating layer a first body section comprising an island-shaped semiconductor, a second body section comprising an island-shaped semiconductor, and a ridge-shaped connecting section interconnecting the first body section and the second body section; (B) forming a gate electrode to cover a periphery of a channel region formed by at least a part of the connecting section in lengthwise direction of the connecting section, with a second insulating layer intervening therebetween; and (C) forming a source region to extend over the first body section and a portion of the connecting section between the first body section and the channel region and a drain region to extend over the second body section and a portion of the connecting section between the second body section and the channel region, wherein the step (A) includes imparting a semiconductor forming the channel region with a lattice strain.

This method is capable of forming a strained channel semiconductor layer on a three-dimensional structure and hence fabricating a semiconductor device in which the dominance of the gate over the channel of high carrier mobility is enhanced. As a result, it is possible to obtain a semiconductor device having a high current driving ability even at a low voltage and highly suited to miniaturization.

The semiconductor forming the channel region may comprise a first semiconductor, and a second semiconductor having a smaller lattice constant than the first semiconductor.

The step (A) may include: forming on the first insulating layer a first relaxed semiconductor layer comprising the first semiconductor of which lattice is relaxed; and then epitaxially growing the second semiconductor over side and top surfaces of the first relaxed semiconductor layer to form a first strained semiconductor layer.

The step (A) may include: forming on the first insulating layer a second relaxed semiconductor layer comprising the second semiconductor of which lattice is relaxed; subsequently, epitaxially growing the first semiconductor on the second relaxed semiconductor layer to form a second strained semiconductor layer; and then epitaxially growing the second semiconductor over side and top surfaces of a stacked structure comprising the second relaxed semiconductor layer and the second strained semiconductor layer to form a partially strained semiconductor layer.

It is possible that the first semiconductor is silicon-germanium and the second semiconductor is silicon.

The step (A) may include: preparing a SGOI substrate; and using a buried oxide film of the SGOI substrate as the first insulating layer and a silicon-germanium layer of the SGOI substrate as a layer of the first semiconductor. This feature makes it possible to easily fabricate a semiconductor device having a channel partially formed of strained silicon.

The step (A) may include: preparing a substrate obtained by epitaxially growing a silicon-germanium layer on a silicon layer of a SOI substrate; and using a buried oxide layer, the silicon layer and the silicon-germanium layer of the substrate thus provided as the first insulating layer, a layer of the second semiconductor and a layer of the first semiconductor, respectively. This feature makes it possible to reduce the difficulty in fabricating a semiconductor device having a channel partially formed of strained silicon.

The foregoing and other objects, features and advantages of the present invention will become more apparent from the reading of the following detailed description of the preferred embodiments with reference to the accompanying drawings.

BRIEF DESCRIPTION OF DRAWINGS

FIG. 4A is a plan view and FIGS. 4B and 4C are sectional views taken on lines IVB-IVB and IVC-IVC, respectively, of FIG. 4A;

FIG. 5A is a plan view and FIGS. 5B and 5C are sectional views taken on lines VB-VB and VC-VC, respectively, of FIG. 5A;

FIG. 6A is a plan view and FIGS. 6B and 6C are sectional views taken on lines VIB-VIB and VIC-VIC, respectively, of FIG. 6A;

FIG. 7A is a plan view and FIGS. 7B and 7C are sectional views taken on lines VIIB-VIIB and VIIC-VIIC, respectively, of FIG. 7A;

FIG. 8A is a plan view and FIGS. 8B and 8C are sectional views taken on lines VIIIB-VIIIB and VIIIC-VIIIC, respectively, of FIG. 8A;

FIG. 12A is a plan view and FIGS. 12B and 12C are sectional views taken on lines XIIB-XIIB and XIIC-XIIC, respectively, of FIG. 12A;

FIG. 13A is a plan view and FIGS. 13B and 13C are sectional views taken on lines XIIIB-XIIIB and XIIIC-XIIIC, respectively, of FIG. 13A;

FIG. 14A is a plan view and FIGS. 14B and 14C are sectional views taken on lines XIVB-XIVB and XIVC-XIVC, respectively, of FIG. 14A;

FIG. 15A is a plan view and FIGS. 15B and 15C are sectional views taken on lines XVB-XVB and XVC-XVC, respectively, of FIG. 15A;

FIG. 16A is a plan view and FIGS. 16B and 16C are sectional views taken on lines XVIB-XVIB and XVIC-XVIC, respectively, of FIG. 16A;

BEST MODE FOR CARRYING OUT THE INVENTION

Hereinafter, embodiments of the present invention will be described with reference to the drawings.

First Embodiment

Figure 1:
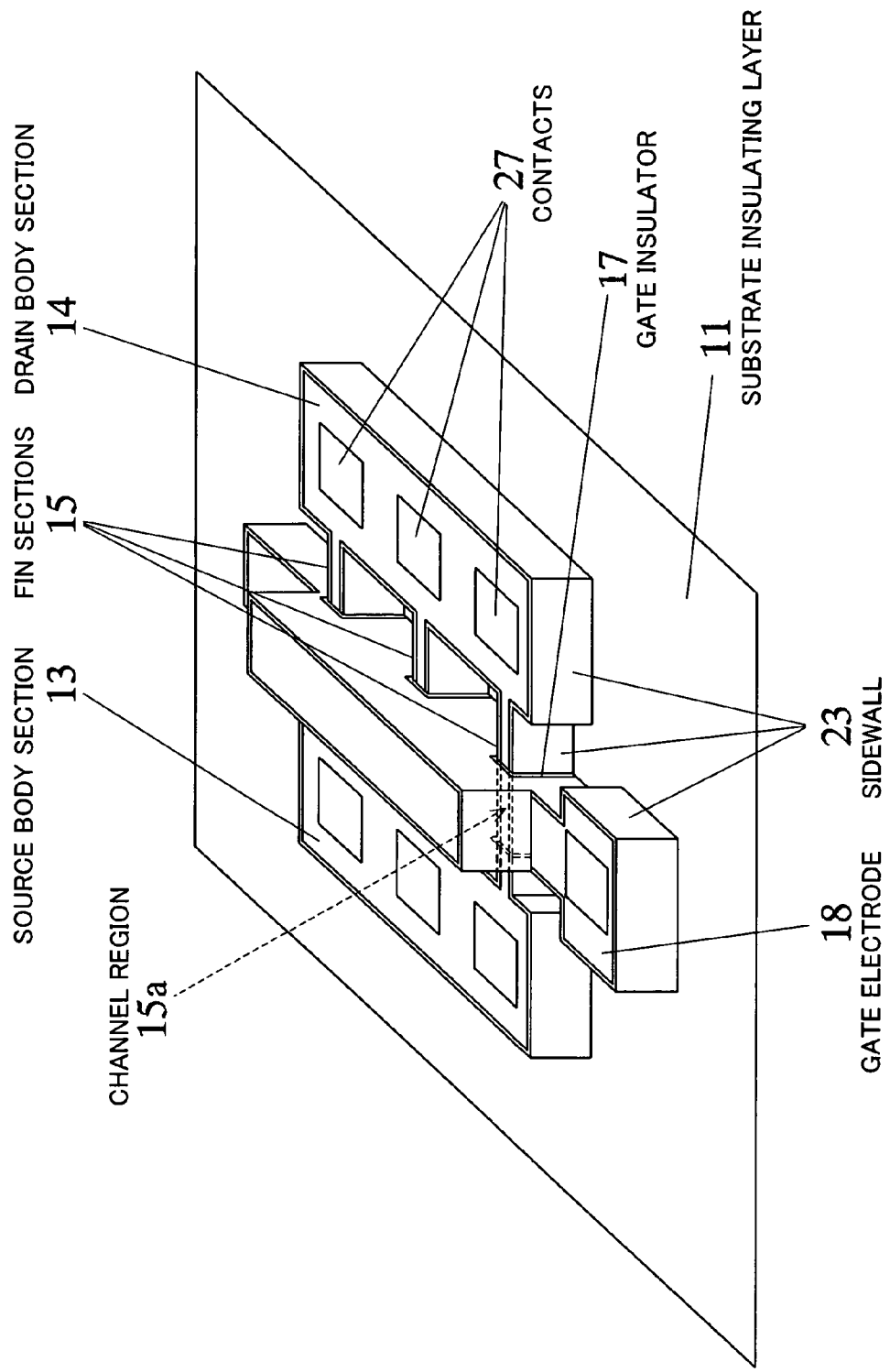
FIG. 1 is a perspective view schematically showing the construction of a semiconductor device according to a first embodiment of the present invention.

FIG. 1 is a perspective view schematically showing the construction of a semiconductor device according to a first embodiment of the present invention.

As shown in FIG. 1, the semiconductor device according to this embodiment comprises a fin FET having as major components thereof a source body section (first body section) 13, a drain body section (second body section) 14, a fin section (connecting section) 15, a gate insulator (second insulating layer) 17, and a gate electrode 18. In FIG. 1, such components as a silicide layer, an interlayer insulator and interconnections are not shown.

The source body section 13 and the drain body section 14 are each formed into a rectangular parallelepiped shape and are positioned opposite to each other on a substrate insulating layer 11. A plurality of (three in the figure) plate-shaped fin sections 15 stand as spaced from each other on the substrate insulating layer (first insulating layer) in such a manner that the opposite ends of each of the fin sections 15 are connected to respective of the source body section 13 and the drain body section 14. A gate insulator 17 is formed to cover side and top surfaces of a central portion (hereinafter will be referred to as channel region) 15a of each fin section 15. A gate electrode 18 is formed on the substrate insulating layer 11 in such a manner as to: cover the side and top surfaces of each of the three fin sections 15, with the gate insulator 17 intervening therebetween; fill up the space between adjacent ones of the three fin sections 15; and extend to cross the three fin sections 15 at right angles in a plan view. Side surfaces of the gate electrode 18 are covered with sidewall 23. The sidewall 23 also covers side surface portions of the source body section 13 and drain body section 14 other than the portions connecting to the fin sections 15 as well as side surface portions of the fin sections 15 not covered with the gate insulator 17. Each of the source body section 13 and drain body section 14 has a top surface provided with three contacts 27 each associated with a respective one of the fin sections 15. Another contact 27 is formed on a top surface of an end portion of the gate electrode 18 situated in the gate width direction (orthogonal to the fin sections 15).

Figure 2:
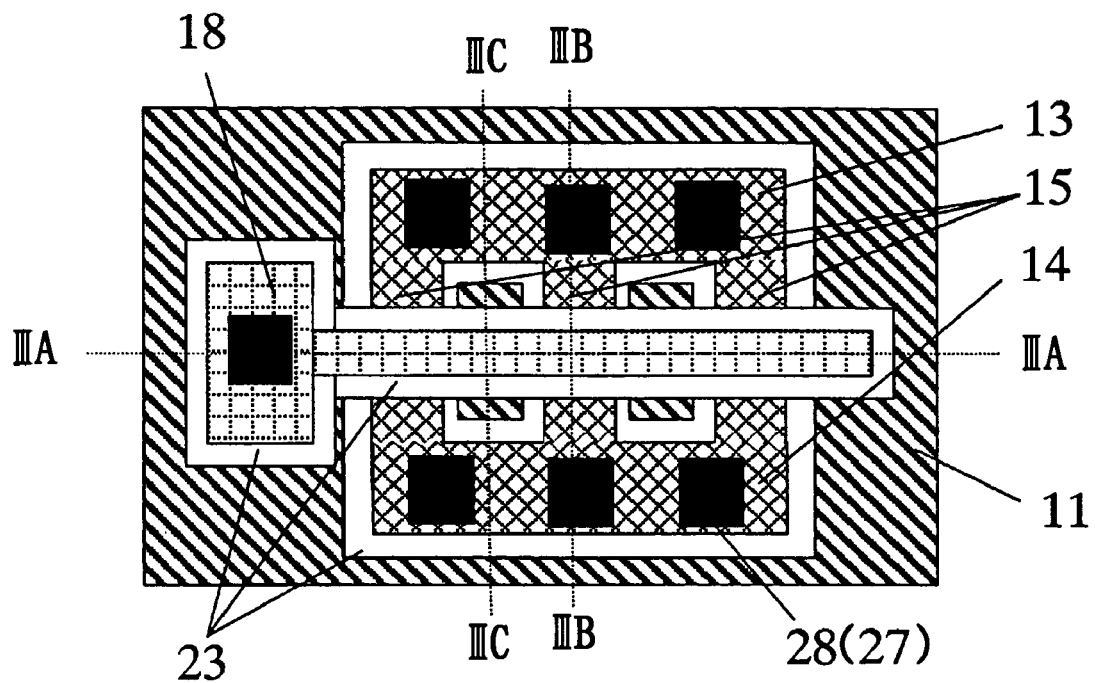
FIG. 2 is a plan view showing the construction of the semiconductor device shown in FIG. 1.
Figure 3A:
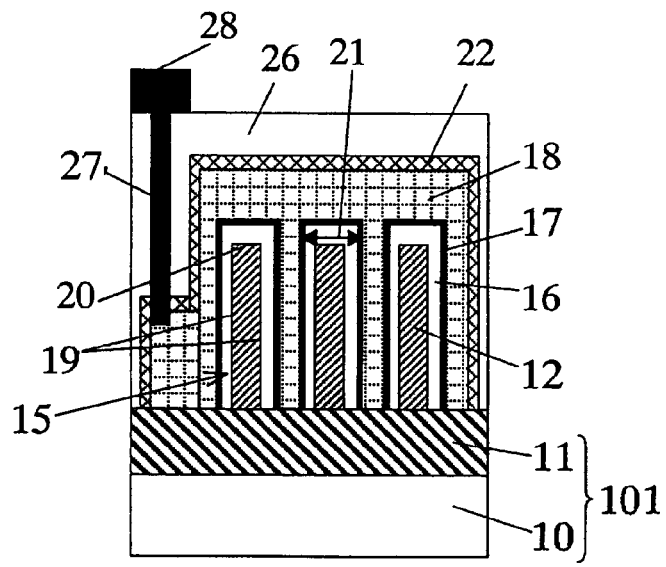
FIGS. 3A to 3C are sectional views taken on lines IIIA-IIIA, IIIB-IIIB and IIIC-IIIC, respectively, of FIG. 2.
Figure 3B:
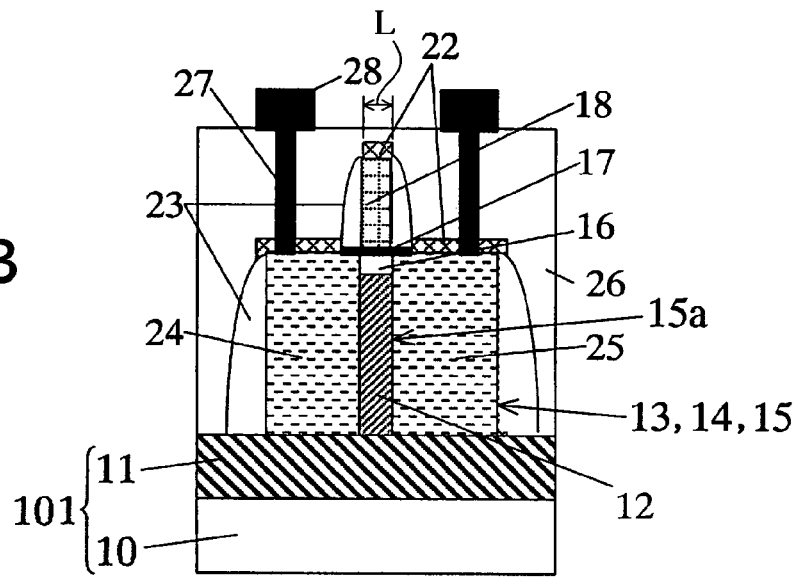
Figure 3C:
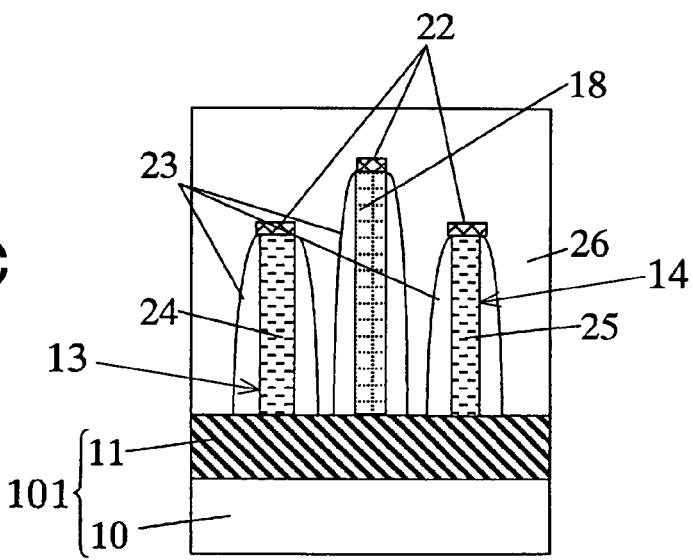

FIG. 2 is a plan view showing the construction of the semiconductor device shown in FIG. 1; and FIGS. 3A to 3C are sectional views taken on lines IIIA-IIIA, IIIB-IIIB and IIIC-IIIC, respectively, of FIG. 2. FIGS. 3A to 3D are drawn by appropriately reducing or enlarging the horizontal dimensions (parallel with the principal surface of a substrate 101) of the semiconductor device shown in the plan view at FIG. 2.

As shown in FIGS. 2 and 3A to 3C, the semiconductor device according to the present embodiment includes semiconductor substrate 101. The semiconductor substrate 101 comprises a support substrate 10 formed of silicon or the like, and the substrate insulating layer 11 (not more than substantially 400 nm) formed of an oxide film layer on the support substrate 10.

In each of the fin sections 15, a lattice-relaxed silicon-germanium layer (hereinafter will be referred to as a relaxed SiGe layer) 12 is formed on the substrate insulating layer 11 so as to be positioned in a central portion (channel region) 15a of the fin section 15 in longitudinal direction of the fin section 15 (in directions parallel with the principal surface of the substrate 101). The relaxed SiGe layer 12, as a whole, is formed into a quadratic prism shape extending vertically (thicknesswise of the substrate 101). The relaxed SiGe layer 12 preferably has a germanium concentration of not less than 10% and not more than 60%, more preferably not less than 20% and not more than 50%. The height of the relaxed SiGe layer 12 is preferably not less than substantially 30 nm and not more than substantially 100 nm.

A silicon layer 16 having a tensile strain (hereinafter will be referred to as stained Si layer) is formed to cover side and top surfaces of the relaxed SiGe layer 12 of the quadratic prism shape. The strained Si layer 16 preferably has a thickness of not less than substantially 5 nm and not more than substantially 50 nm. The strain of the strained Si layer 16 is preferably not less than 0.8% and not more than 5.0%, more preferably not less than 1.6% and not more than 4.2%. Here, the strain of the strained Si layer 16 is expressed by percentage relative to the lattice constant of Si.

Each of the source body section 13 and the drain body section 14 comprises a relaxed SiGe layer and a strained Si layer, which are each formed at the same time with the formation of a respective one of the relaxed SiGe layer 12 and strained Si layer 16 of each fin section 15. Also, the portion of each fin section 15 other than the channel region 15a (hereinafter will be referred to as non-channel region) comprises a relaxed SiGe layer and a strained Si layer, which are each formed at the same time with the formation of a respective one of the relaxed SiGe layer 12 and strained Si layer 16. The relaxed SiGe layer and strained Si layer of each of the source body section 13, drain body section 14 and the second portion of each fin section 15 are doped with a high concentration of a dopant impurity and hence become a degenerate silicon-germanium layer and a degenerate silicon layer, respectively. The source body section 13 and the portion of the non-channel region of each fin section 15 that connects to the source body section 13 form a source region 24, while the drain body section 14 and the portion of the non-channel region of each fin section 14 that connects to the drain body section 14 form a drain region 25.

The gate insulator 17 is formed to cover the strained Si layer 16 on the channel region 15a and portions of the non-channel region situated on both sides of the strained Si layer 16 in each fin section 15. The gate insulator 17 comprises, for example, an oxinitride film (thickness: substantially 1 to substantially 5 nm) or an $HfO_2$ film (thickness: not more than substantially 30 nm), which is a high dielectric constant insulating film.

The gate electrode 18 is formed on the gate insulator 17 so as to be positioned above the strained Si layer 16 in each fin section 15. The thickness of the gate electrode 18 is substantially 50 to substantially 150 nm. The gate electrode 18 comprises, for example, degenerate polysilicon or polysilicon-germanium doped with a high concentration of a dopant impurity.

In use, the above-described construction allows the strained Si layer 16 formed over both side portions 19 and top portion 20 of each fin section 15 to form a channel, as shown in FIG. 3A.

Each fin section 15 preferably has a width 21 falling within a range from substantially 15 nm to substantially 100 nm and desirably becomes completely depleted throughout the width 21 by application of the gate voltage. Specifically, the dimensions of each fin section 15 and gate electrode 18 are desirably established so that ½ of the width 21 of the strained Si layer (i.e., width of each fin section 15) is not more than substantially ⅓ of gate length L (see FIG. 3B).

By so doing, the dominance of the gate voltage applied to the gate electrode 18 over the channel is enhanced thereby suppressing the short channel effect. In addition, it is possible to obtain an ideal subthreshold characteristic (subthreshold coefficient=60 meV/decade) thereby to obtain a higher current driving ability at a low voltage.

A silicide film 22 is formed on top surfaces of respective of the gate electrode 18, source region 24 and drain region 25 by using Co or Ni for example.

In the fin sections 15, the sidewall 23 is formed on the gate insulator 17 so as to cover the both side surfaces of the gate electrode 18. Also, as has been already described, since the sidewall 23 is formed to cover the both side surfaces of the gate electrode 18, specific portions of side surfaces of the source and drain body sections 13 and 14 and specific portions of side surfaces of each fin section 15, the silicide layer 22 can be formed in a self-aligned fashion.

Examples of dopant impurities for doping the gate electrode 18, source region 24 and drain region 25 include phosphorus (P) and arsenic (As) for an n-channel FET, and boron (B) for a p-channel FET. It is desirable that the dopant impurity for doping the source region 24 and the drain region 25 be introduced thereinto so that its concentration is kept high (not lower than $1 \times 10^{19}$ $cm^{-3}$) substantially uniformly in the depthwise direction (the direction along the thickness of the substrate 101) down to the interface with the substrate insulating layer 11.

Thus, the distance between the channel formed to extend through not only the top portion 20 but also the both side portions 19 of each fin section 15 and each of the source region 24 and drain region 25 is made shorter, which results in a reduced parasitic resistance.

It is desirable that the dopant impurity for doping the gate electrode 18 be introduced thereinto so that its concentration in a portion of the gate electrode 18 intermediate adjacent ones of the fin sections 15 is kept high (not lower than $1 \times 10^{19}$ $cm^{-3}$) substantially uniformly in the depthwise direction (the direction along the thickness of the substrate 101) down to the interface with the substrate insulating layer 11. This feature allows the gate voltage to be applied to the entire side portions 19 of each fin section 15 uniformly thereby reliably forming the channel in the side portions 19 even at locations adjacent to the substrate insulating layer 11.

An interlayer insulator 26 is formed over the substrate 101 so as to cover the source body section 13, drain body section 14, fin sections 15, gate insulator 17 and gate electrode 18, which are covered with the silicide film 22 and sidewall 23. Contact holes are formed to extend from the surface of the interlayer insulator 26 to the silicide film 22 on the source body section 13, drain body section 14 and gate electrode 18 through the interlayer insulator 26. The contact holes are filled up with metal plug formed of W for example to form contacts 27. Metal interconnections 28 of Al, Cu or the like are formed on the surface of the interlayer insulator 26 so as to connect to the upper ends of the contacts 27. Thus, each of the gate electrode 18, source region 24 and drain region 25 can independently be applied with a voltage through the associated metal interconnections 28 and contact 27.

Next, description will be made of a method of fabricating the semiconductor device thus constructed.

Figure 4A:
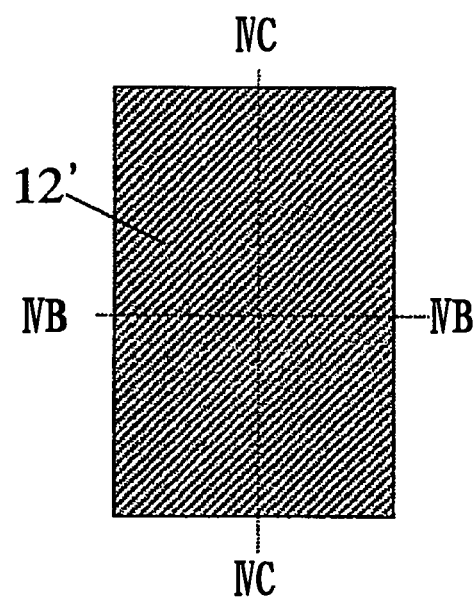
FIGS. 4A to 4C illustrate process steps of a method of fabricating the semiconductor device shown in FIG. 1; specifically.
Figure 6A:
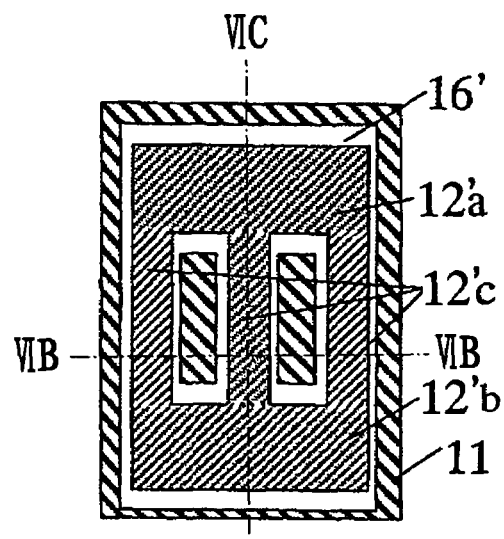
FIGS. 6A to 6C illustrate process steps of the method of fabricating the semiconductor device shown in FIG. 1; specifically.
Figure 6B:
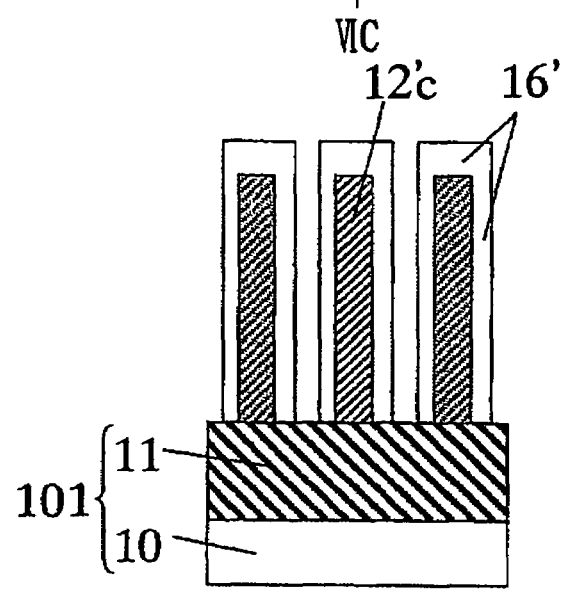
Figure 6C:
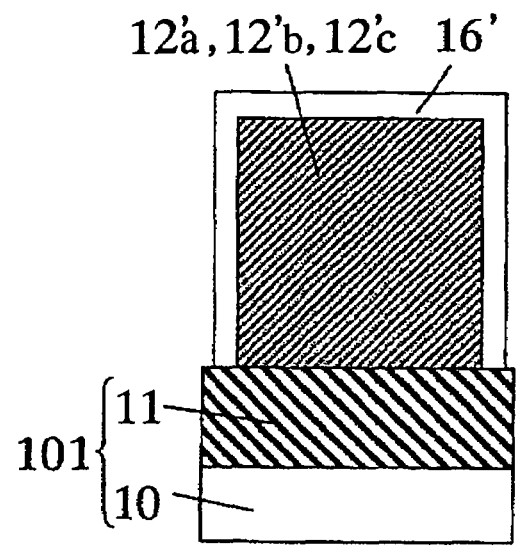
Figure 7A:
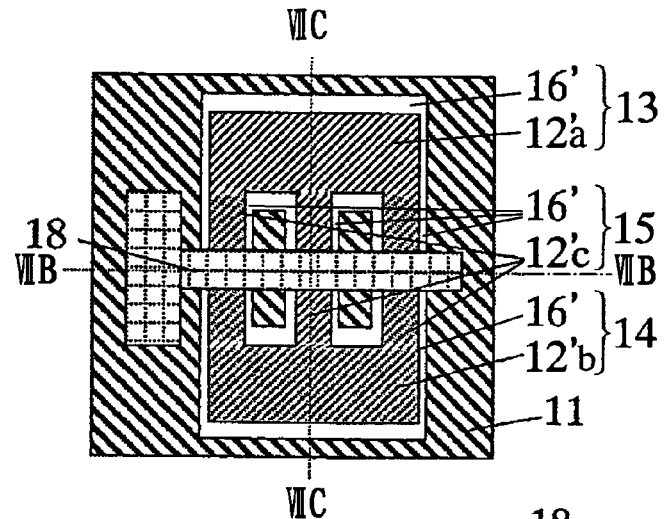
FIGS. 7A to 7C illustrate process steps of the method of fabricating the semiconductor device shown in FIG. 1; specifically.
Figure 7B:
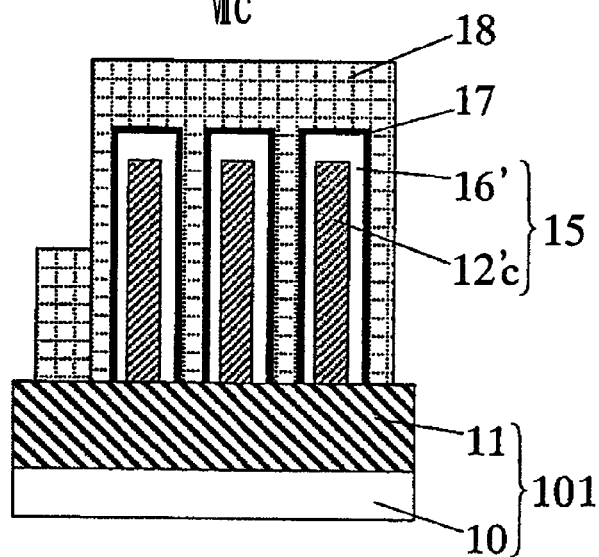
Figure 7C:
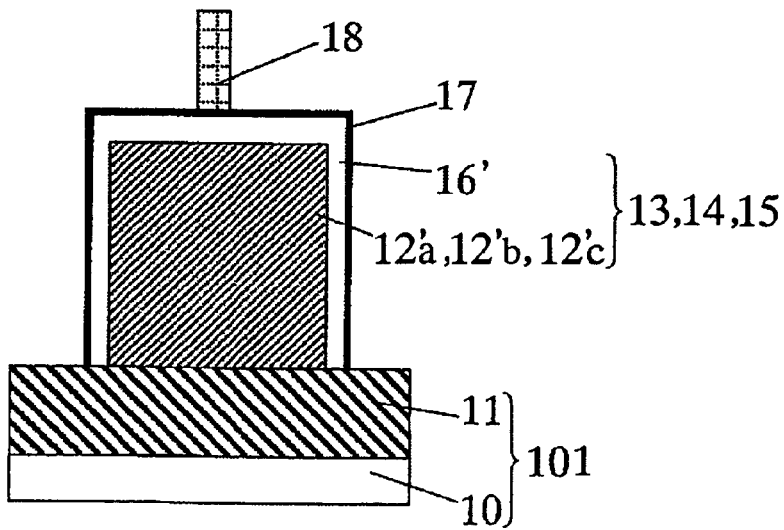
Figure 8A:
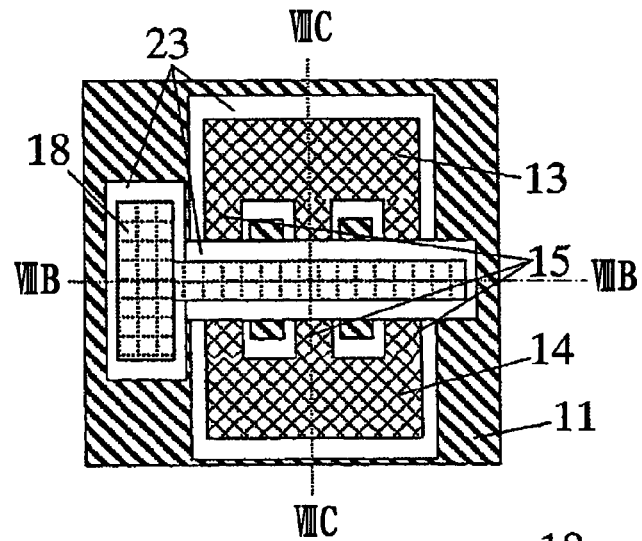
FIGS. 8A to 8C illustrate process steps of the method of fabricating the semiconductor device shown in FIG. 1; specifically.
Figure 8B:
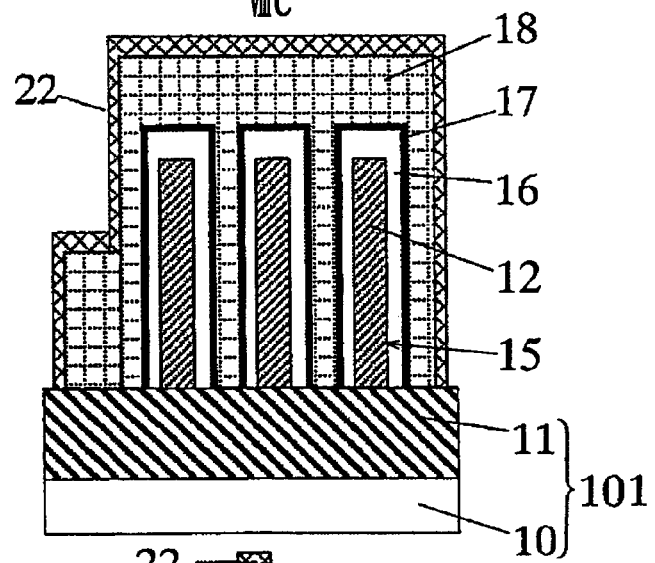
Figure 8C:
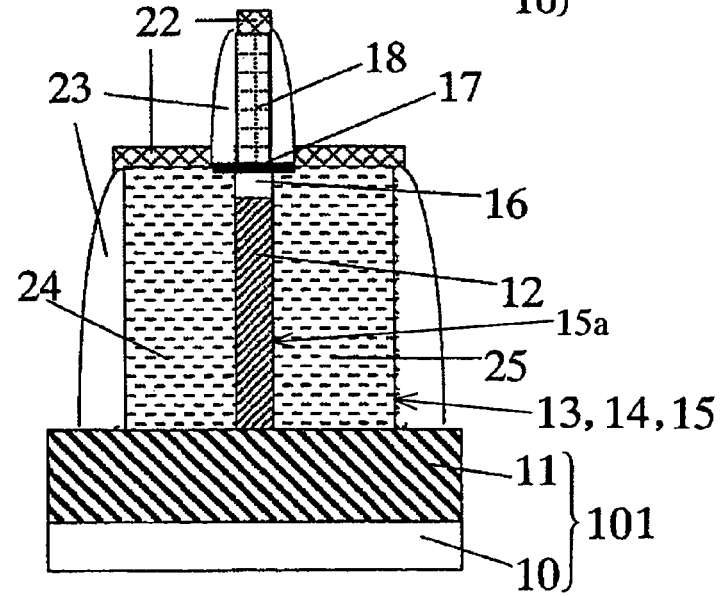

FIGS. 4A to 8C illustrate process steps of a method of fabricating the semiconductor device shown in FIG. 1. Here, FIG. 4A is a plan view and FIGS. 4B and 4C are sectional views taken on lines IVB-IVB and IVC-IVC, respectively, of FIG. 4A; FIG. 5A is a plan view and FIGS. 5B and 5C are sectional views taken on lines VB-VB and VC-VC, respectively, of FIG. 5A; FIG. 6A is a plan view and FIGS. 6B and 6C are sectional views taken on lines VIB-VIB and VIC-VIC, respectively, of FIG. 6A; FIG. 7A is a plan view and FIGS. 7B and 7C are sectional views taken on lines VIIB-VIIB and VIIC-VIIC, respectively, of FIG. 7A; and FIG. 8A is a plan view and FIGS. 8B and 8C are sectional views taken on lines VIIIB-VIIIB and VIIIC-VIIIC, respectively, of FIG. 8A.

Figure 4B:
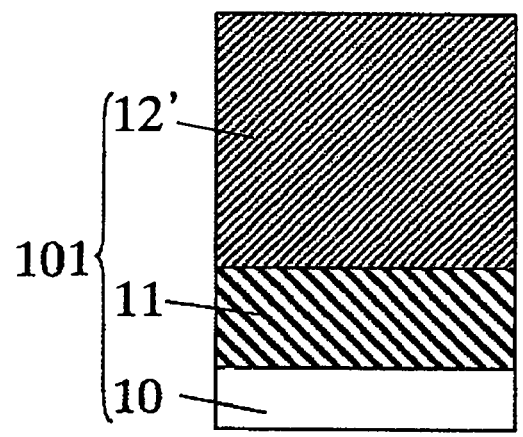
Figure 4C:
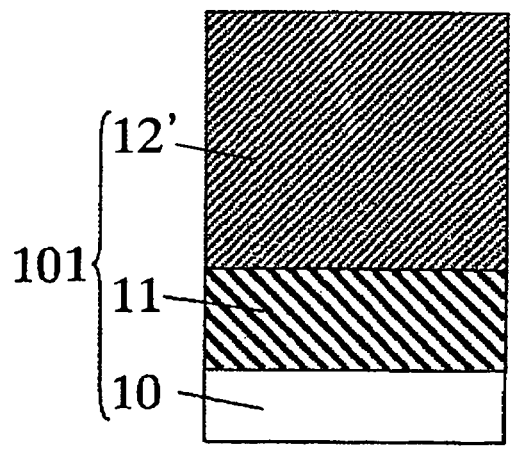

Semiconductor substrate 101 is prepared in the process illustrated in FIGS. 4A to 4C. Used as the semiconductor substrate 101 is, for example, a SGOI (Silicon Germanium on Insulator) substrate comprising a silicon layer 10 (support substrate), a buried oxide film (substrate insulating layer (thickness: not more than substantially 400 nm)), and a lattice-relaxed silicon-germanium layer 12' (germanium concentration: 10-50%, thickness: substantially 30 to substantially 100 nm) formed on the buried oxide film.

Figure 5A:
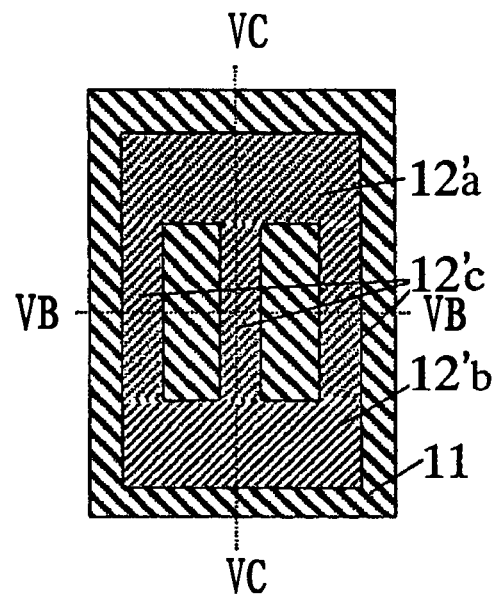
FIGS. 5A to 5C illustrate process steps of the method of fabricating the semiconductor device shown in FIG. 1; specifically.
Figure 5B:
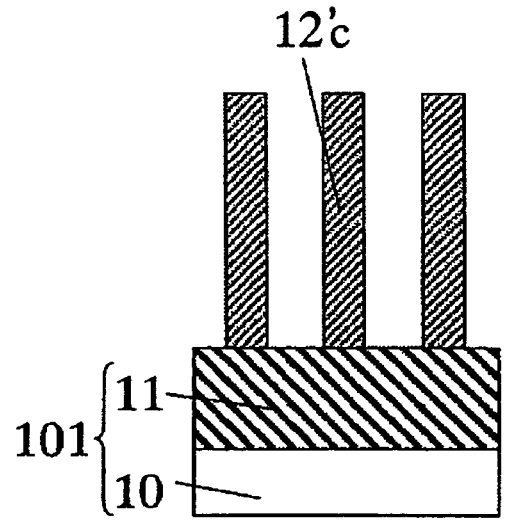
Figure 5C:
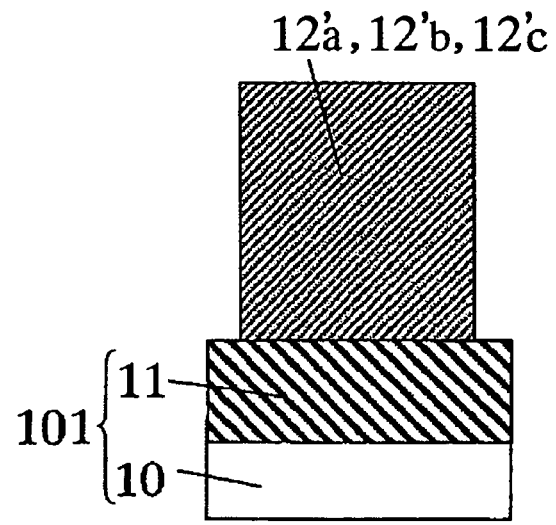

In the subsequent process steps illustrated in FIGS. 5A to 5C, firstly, a device region is defined. Specifically, the lattice-relaxed silicon-germanium layer 12' is subjected to dry etching with use of a patterned resist mask or a silicon oxide film deposited by plasma CVD (Chemical Vapor Deposition) or a like process as a hard mask, to form a rectangular parallelepiped section (hereinafter will be referred to as a relaxed SiGe source body section) 12'a which will finally form the source body section 13, a rectangular parallelepiped section (hereinafter will be referred to as a relaxed SiGe drain body section) 12'b which will finally form the drain body section 14, and three plate-shaped sections (hereinafter will be referred to as relaxed SiGe fin sections) 12'c which will finally form the fin sections 15. Here, the relaxed SiGe source body section 12'a and the relaxed SiGe drain body section 12'b are formed so as to be positioned opposite to each other, while the three relaxed SiGe fin sections 12'c formed to interconnect the relaxed SiGe source body section 12'a and the relaxed SiGe drain body section 12'b. In this way, the device region is defined on the substrate 101.

In the subsequent process steps illustrated in FIGS. 6A to 6C, a silicon film is epitaxially grown over the entire device region thus defined at a temperature of 500 to 650° C. by using UHV-CVD (Ultra High Vacuum-Chemical Vapor Deposition), to form a strained silicon film 16' having a tensile strain and a thickness of substantially 10 to substantially 50 nm. Thus, the strained silicon film 16' is formed to cover the top and side surfaces of respective of the relaxed SiGe source body section 12'a, relaxed SiGe drain body section 12'b and three relaxed SiGe fin sections 12'c. As a result, the relaxed SiGe source body section 12'a and strained silicon film 16' formed over the top and side surfaces thereof form the source body section 13; the relaxed SiGe drain body section 12'b and strained silicon film 16' formed over the top and side surfaces thereof form the drain body section 14; and the relaxed SiGe fin sections 12'c and strained silicon film 16' formed over the top and side surfaces thereof form the fin sections 15.

In the subsequent process steps illustrated in FIGS. 7A to 7C, the entire strained silicon film 16' is subjected to rapid thermal oxidation for a short time at a temperature of 800° C. to 1000° C. for example, to form a silicon oxide film 17' having a thickness of 1 to 5 nm which will finally form the gate insulator 17. Instead of the silicon oxide film 17', it is possible to form either an oxinitride film by plasma-nitriding an oxide film or a high dielectric constant insulating film formed of $HfO_2$ by sputtering or a like process.

Subsequently, a conductive film which will finally form the gate electrode 18 is formed on the silicon oxide film 17'. For example, a polysilicon film is formed to a thickness of 50 to 200 nm over the entire surface of the semiconductor substrate 101, on which the silicon oxide film 17' is formed, by LP-CVD (Low Pressure-Chemical Vapor Deposition). The polysilicon film thus formed is doped with a dopant impurity to a high concentration of not less than $5\times10^{19}$ $cm^{-3}$ by ion implantation or a like process and then subjected to a rapid heat treatment in a nitrogen atmosphere for activation of the dopant impurity.

Thereafter, the polysilicon film is subjected to dry etching with use of a patterned resist mask or a silicon oxide film deposited by plasma CVD (Chemical Vapor Deposition) or a like process as a hard mask, to form the gate electrode 18 comprising a degenerate polysilicon layer.

Care should be taken here to bury the gate electrode 18 so that it certainly reaches the substrate insulating layer 11 in a place between adjacent ones of the fin sections 15 as shown in FIG. 7B as well as to prevent polysilicon residue from remaining on the side surfaces of respective of the source body section 13 and the drain body section 14 after dry etching. For example, in the dry etching of polysilicon such a process is effective which includes performing main etching under highly anisotropic etching conditions and then overetching under highly isotropic etching conditions to prevent polysilicon from remaining on the side surfaces of respective of the source body section 13 and the drain body section 14 like sidewall.

In the subsequent process steps illustrated in FIGS. 8A to 8C, a common CMOS process is utilized to form the sidewall 23 comprising a silicon oxide film or a like film so that the sidewall 23 covers the side surfaces of the gate electrode 18 and specific portions of the side surfaces of respective of the source body section 13, drain body section 14 and fin sections 15. Thereafter, the source body section 13, drain body section 14 and the non-channel region of each fin section 15 are doped with a dopant impurity by ion implantation and then subjected to a rapid heat treatment, to form the source region 24 and the drain region 25. By so doing, the relaxed SiGe layer 12 and the stained Si layer 16 are formed in the channel region 15a of each fin section 15. Thereafter, the silicide film 22 is formed over the top surfaces of respective of the gate electrode 18, source region 24 and drain region 25.

Subsequently, as shown in FIGS. 2 and 3A to 3C, the interlayer insulator 26 comprising a silicon oxide film or a like film is formed over the entire surface of the substrate 101 on which the silicide film 22 is formed and then planarized by CMP (Chemical Mechanical Polishing). Thereafter, the contacts 27 each comprising a metal plug of W or the like are formed to extend through the interlayer insulator 26 and then the metal interconnections 28 of Al, CU or the like are formed on the surface of the interlayer insulator 26 so as to connect to the upper ends of respective of the contacts 27. Thus, the fin FET is completed.

It is desirable that in the ion implantation into the source region 24 and the drain region 25 the implantation energy be adjusted so that the impurity concentration is kept as high as $5\times10^{19}$ $cm^{-3}$ or more uniformly in the depthwise direction of the source and drain regions 24 and 25.

Figure 9:
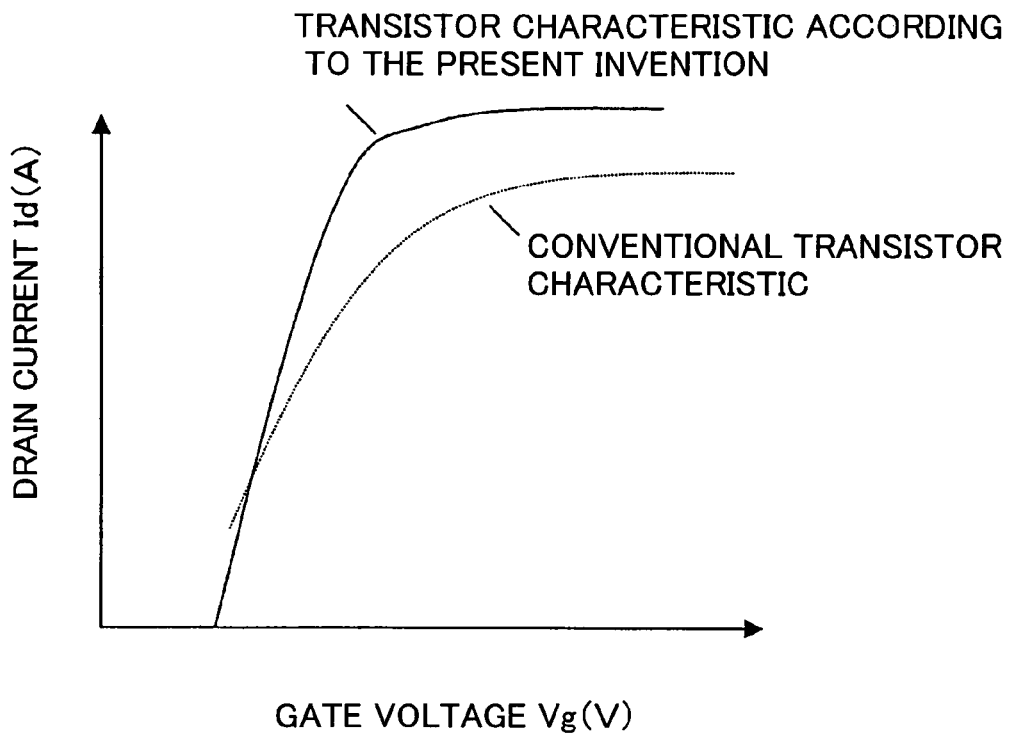
FIG. 9 is a graph comparing the semiconductor device according to the first embodiment to a conventional device as to gate voltage-drain current characteristic.

With reference to FIGS. 3A to 3C and 9, description will be made of the operation of the semiconductor device thus constructed and fabricated. FIG. 9 is a graph comparing the semiconductor device according to the first embodiment to a conventional device as to gate voltage-drain current characteristic.

Referring to FIGS. 3A to 3C, for example, when drain voltage Vd and gate voltage Vg that is higher than the threshold voltage are applied to the drain region 25 and the gate electrode, respectively, with the source region 24 grounded, a channel is formed in the strained Si layer 16 to allow drain current Id to pass therethrough between the source region 24 and the drain region 25. Since the channel-forming semiconductor layer is formed of the strained Si layer 16 in the semiconductor device according to the present embodiment, the high carrier mobility thereof improves the current driving ability of the semiconductor device as compared with that of the conventional device, as shown in FIG. 9. In the case where the germanium concentration of the relaxed SiGe layer 12 in the semiconductor device according to the present embodiment is substantially 30% for example, the strained silicon 16 formed thereon can be expected to exhibit an effective electron mobility improved by substantially 60 to 80% as compared with a conventional strainless Si layer.

Further, since the three-dimensional channel structure comprising the strained Si layer 16 formed over the top portion 20 and side portions 19 of each fin section 15 is surrounded by the gate electrode 18 according to the present embodiment, the gate electrode 18 has enhanced dominance over the channel thereby ensuring a high current driving ability even at a low voltage while suppressing the short channel effect. For this reason, the device according to the present embodiment is suited to miniaturization.

FIRST EXAMPLE

Hereinafter, a semiconductor device and a fabrication method thereof according to a first example will be described with reference to FIGS. 4A to 8C.

A semiconductor substrate 101 is prepared in the process illustrated in FIGS. 4A to 4C. Used as the semiconductor substrate 101 is, for example, a SGOI (Silicon Germanium on Insulator) substrate comprising a silicon layer 10, a buried oxide film (substrate insulating layer (thickness: not more than substantially 400 nm)), and a lattice-relaxed silicon-germanium layer 12' (germanium concentration: 30%, thickness: 100 nm) formed on the buried oxide film.

In the subsequent process steps illustrated in FIGS. 5A to 5C, firstly, a device region is defined. Specifically, a silicon oxide film, which has been deposited over the entire substrate surface by plasma CVD (Chemical Vapor Deposition) at substantially 600° C., is patterned into a hard mask by dry etching with a resist mask. A size of the hard mask is possible to adjust to an exposure limit size or smaller in such a manner that the hard mask is previously formed to have a large size and then is wet-etched using diluted hydrofluoric acid at a well-controlled etching rate.

The lattice-relaxed silicon-germanium layer 12' is subjected to dry etching with use of this hard mask to form a relaxed SiGe source body section 12'a, a relaxed SiGe drain body section 12'b, and relaxed SiGe fin sections 12'c (width: substantially 30 nm). Here, the relaxed SiGe source body section 12'a and the relaxed SiGe drain body section 12'b are formed so as to be positioned opposite to each other, while the three relaxed SiGe fin sections 12'c formed to interconnect the relaxed SiGe source body section 12'a and the relaxed SiGe drain body section 12'b. In this way, the device region is defined on the substrate 101.

Subsequently, the etching mask is completely removed away by wet etching with hydrofluoric acid and then wafer cleaning is performed to clean the surface of the substrate 101.

In the subsequent process steps illustrated in FIGS. 6A to 6C, a silicon film is epitaxially grown over the entire device region thus defined at a temperature of 600° C. by using UHV-CVD, to form a strained silicon film 16' having a tensile strain and a thickness of substantially 15 nm. Thus, the strained silicon film 16' is formed to cover the top and side surfaces of respective of the relaxed SiGe source body section 12'a, relaxed SiGe drain body section 12'b and three relaxed SiGe fin sections 12'c. As a result, the relaxed SiGe source body section 12'a and strained silicon film 16' formed over the top and side surfaces thereof form a source body section 13; the relaxed SiGe drain body section 12'b and strained silicon film 16' formed over the top and side surfaces thereof form a drain body section 14; and the relaxed SiGe fin sections 12'c and strained silicon film 16' formed over the top and side surfaces thereof form fin sections 15.

In the subsequent process steps illustrated in FIGS. 7A to 7C, the entire strained silicon film 16' is subjected to rapid thermal oxidation at a temperature of substantially 850° C. for a short time, to form a silicon oxide film 17' having a thickness of 2 nm.

Subsequently, a polysilicon film which will finally form a gate electrode 18 is formed to a thickness of 150 nm over the silicon oxide film 17' by LP-CVD. The polysilicon film thus formed is doped with phosphorus ion (P+) to a high concentration of not less than $1\times10^{19}$ cm$^{-3}$ by ion implantation (substantially 10 keV and a dose of substantially $1\times10^{19}$ cm$^{-3}$).

Thereafter, a hard mask of silicon oxide film is formed on the polysilicon film by performing dry etching with a resist mask to pattern a silicon oxide film deposited by plasma CVD by. The polysilicon film is subjected to dry etching with use of this hard mask, to obtain the gate electrode 18 comprising a degenerate polysilicon layer (gate length: substantially 90 nm).

Care should be taken here to bury the gate electrode 18 so that it certainly reaches the substrate insulating layer (buried oxide film) 11 as shown in FIG. 8B as well as to prevent polysilicon residue from remaining on the side surfaces of respective of the source body section 13 and the drain body section 14 after dry etching. The dry etching of polysilicon includes: performing main etching under highly anisotropic etching conditions; detecting the extremity of the polysilicon layer; and then performing overetching under highly isotropic etching conditions with the gas pressure in the chamber made higher than in the main etching, thereby preventing polysilicon from remaining on the side surfaces of respective of the source body section 13 and the drain body section 14 like sidewall.

The remainder of the process can utilize a common CMOS process. As illustrated in FIGS. 8A to 8C, after deposition of a silicon oxide film, the silicon oxide film is entirely etched back to form sidewall 23 (sidewall width: substantially 50 nm). Thereafter, ion implantation of arsenic ion (As+) is performed at substantially 35 keV and a dose of substantially $4\times10^{15}$ cm$^{-2}$ using a resist pattern as a mask, and after complete removal of the resist mask, a rapid heat treatment in a nitrogen atmosphere is conducted at substantially 950° C. for substantially 15 seconds to activate phosphorus in the gate electrode 18 and arsenic in source region 24 and drain region 25. Thus, the gate electrode 18, source region 24 and drain region 25, which are highly degenerate, are formed.

At that time, the source region 24 and the drain region 25 are formed so that the impurity concentration is kept as high as $5\times10^{19}$ cm$^{-3}$ or more substantially uniformly in the depth-wise direction of the source and drain regions 24 and 25. Subsequently, a Co film is deposited to substantially 15 nm over the entire substrate surface by sputtering and then a first rapid thermal treatment in a nitrogen atmosphere (at substantially 500° C. for substantially 30 seconds) is conducted to form a Co silicide film ($Co_2Si$ or CoSi) on the source and drain regions 24 and 25, followed by complete removal of unnecessary Co film deposited on the oxide film by cleaning.

Subsequently, a second rapid thermal treatment in a nitrogen atmosphere (at substantially 850° C. for substantially 30 seconds) is conducted to form a Co silicide film 22 ($Co_2Si$) having a lower resistance on the gate electrode 18 and the source and drain regions 24 and 25 only. Subsequently, as shown in FIGS. 2 and 3A to 3C, an interlayer insulator 26 comprising a silicon oxide film is formed to a thickness of substantially 500 nm over the entire substrate surface and then planarized by CMP.

Thereafter, contact holes extending through the interlayer insulator 26 are formed by dry etching and then filled up with metal plug 27 of tungsten (W). Thereafter, metal interconnections 28 of Cu or Al are formed over the interlayer insulator 26 so that the gate electrode 18, source region 24 and drain region 25 can be voltage-controlled independently. Thus, an n-channel FET is completed.

Since the channel is formed in the strained silicon 16, the n-channel FET fabricated according to the first example enjoys enhanced effective electron mobility and hence has improved current driving ability. Further, the structure, wherein the three-dimensional channel structure comprising the strained Si layer 16 formed over the top and side surfaces of the lattice-relaxed silicon-germanium layer 12 is surrounded by the gate electrode 18, enhances dominance of the gate over the channel thereby ensuring a high current driving ability even at a low voltage while suppressing the short channel effect. For this reason, the n-channel FET according to the first example is a device suited to miniaturization.

While the foregoing example 1 is directed to the construction and fabrication method of the n-channel FET, a p-channel FET construction and a fabrication method thereof can be obtained by using a dopant impurity of opposite polarity. Further, it is possible to obtain a complementary FET using such n-channel transistor and p-channel transistor.

Second Embodiment

Figure 10:
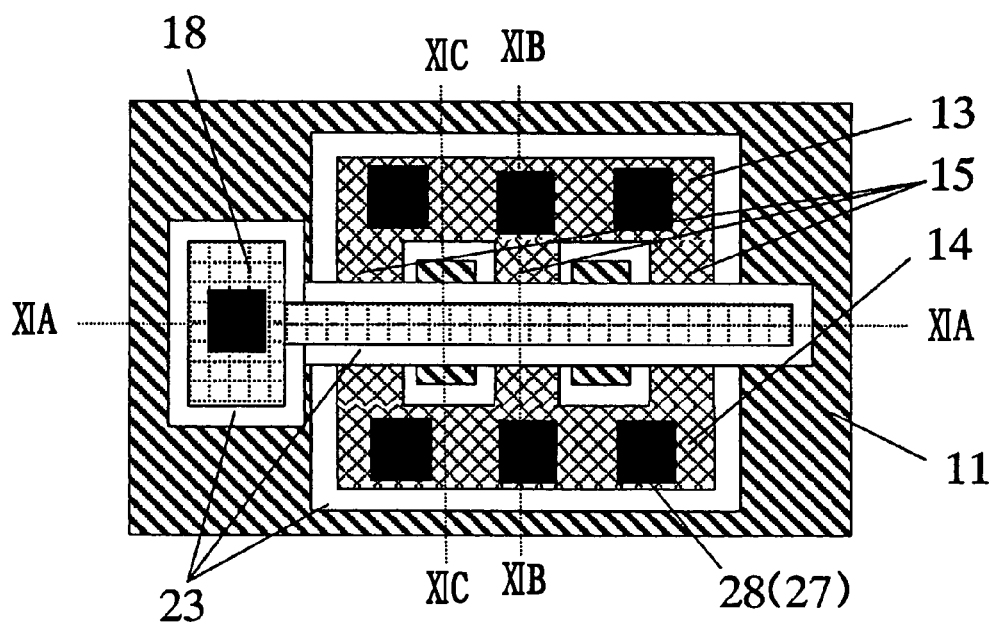
FIG. 10 is a plan view showing the construction of a semiconductor device according to a second embodiment of the present invention.
Figure 11A:
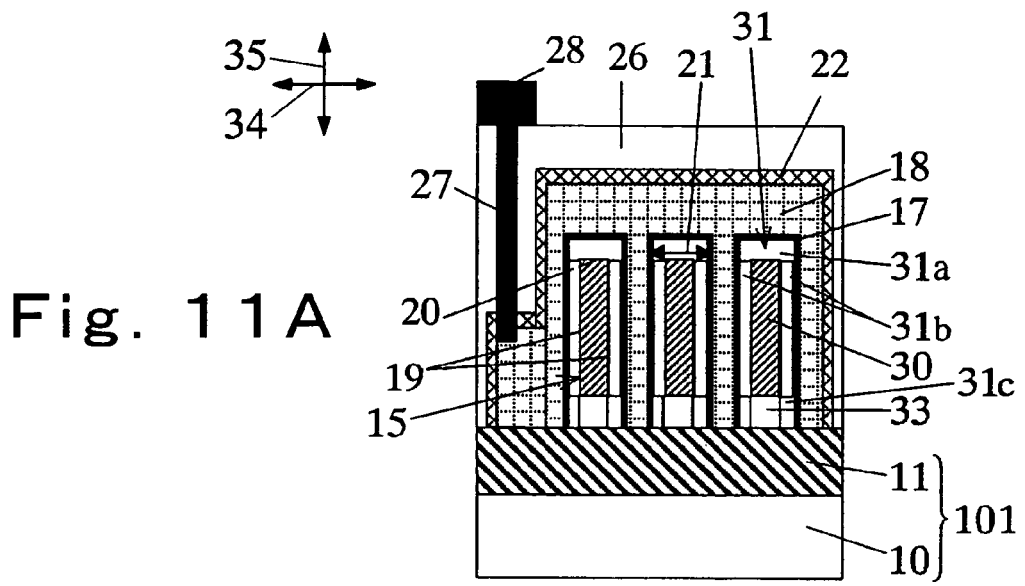
FIGS. 11A to 11C are sectional views taken on lines XIA-XIA, XIB-XIB and XIC-XIC, respectively, of FIG. 10.
Figure 11B:
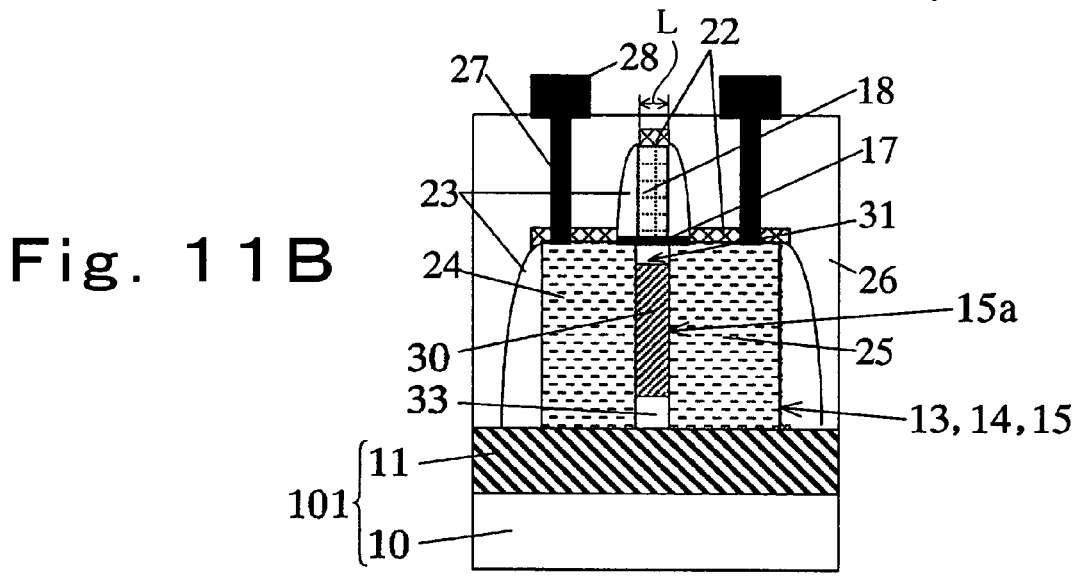
Figure 11C:
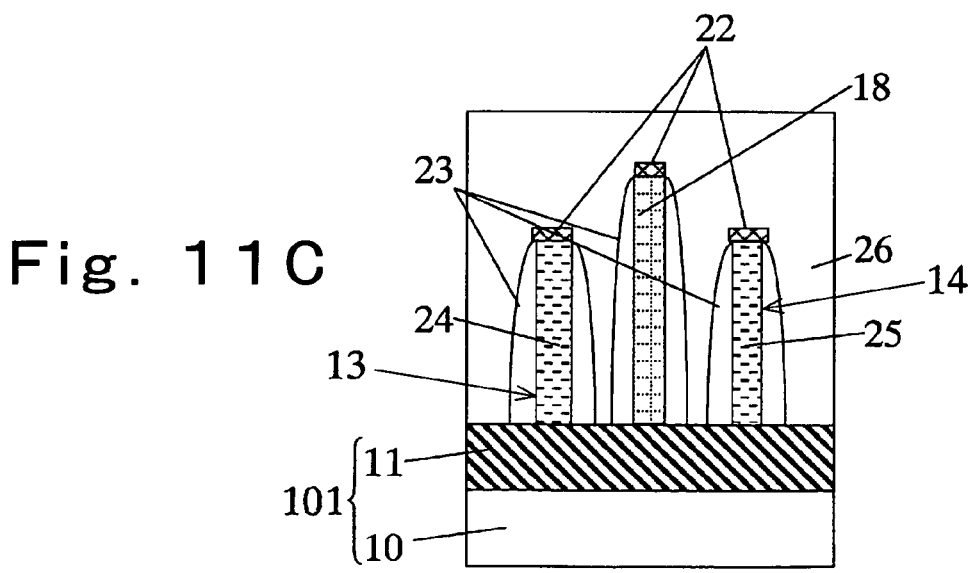

FIG. 10 is a plan view showing the construction of a semiconductor device according to a second embodiment of the present invention; and FIGS. 11A to 11C are sectional views taken on lines XIA-XIA, XIB-XIIB and XIC-XIC, respectively, of FIG. 10. FIGS. 11A to 11C are drawn by appropriately reducing or enlarging the horizontal dimensions (parallel with the principal surface of a substrate 101) of the semiconductor device shown in the plan view at FIG. 10. Like reference characters designate like or corresponding parts throughout FIGS. 10 and 11A to 11C and FIGS. 2 and 3A to 3C.

The present embodiment is different from the first embodiment in the following points. The first point is that the relaxed SiGe layer 12 according to the first embodiment is replaced with a strainless silicon layer (hereinafter will be referred to as a relaxed Si layer) 33 and a strained silicon-germanium layer (hereinafter will be referred to as a strained SiGe layer) 30. The second point is that the strained Si layer 16 according to the second embodiment is replaced with a silicon layer 31 having strain only in a portion 31b formed on side surfaces of the strained SiGe layer 30 (hereinafter will be referred to as a partially strained Si layer). The second embodiment is the same as the first embodiment in other points.

Specifically, in each of the fin sections 15, the relaxed silicon layer 33 is formed on the substrate insulating layer 11 so as to be positioned in a channel region 15a and the strained SiGe layer 30 is formed on the relaxed Si layer 33. The stacked structure comprising the relaxed Si layer 33 and the strained SiGe layer 30 is formed into a vertically extending quadratic prism shape as a whole.

A preferable range of the germanium concentration of the strained SiGe layer 30 will be described later. The height of the stacked structure comprising the relaxed Si layer 33 and the strained SiGe layer 30 is preferably not less than substantially 30 nm and not more than substantially 100 nm.

The partially strained Si layer 31 is formed to cover side and top surfaces of the stacked structure of the quadratic prism shape comprising the relaxed Si layer 33 and the strained SiGe layer 30. The partially strained Si layer 31 preferably has a thickness of not less than substantially 5 nm and not more than substantially 50 nm. The partially strained Si layer 31 comprises a first relaxed portion 31a having no strain formed on the top surface of the strained SiGe layer 30, a stained portion 31b having tensile strain formed on the side surfaces of the strained SiGe layer 30, and a second relaxed portion 31c having no strain formed on the side surfaces of the relaxed Si layer 33. The strain of the strained portion 31b of the partially strained Si layer 31 is preferably not less than 0.8% and not more than 5.0%, more preferably not less than 1.6% and not more than 4.2%. Here, the strain of the strained portion 31b is expressed as a percentage relative to the lattice constant of Si.

Each of source body section 13 and drain body section 14 comprises a relaxed Si layer, a strained SiGe layer and a partially strained Si layer, which are each formed at the same time with the formation of a respective one of the relaxed Si layer 33, strained SiGe layer 30 and partially strained Si layer 31 of the fin sections 15. Also, a non-channel region of each fin section 15 comprises a relaxed Si layer, a strained SiGe layer and a partially strained Si layer, which are each formed at the same time with the formation of a respective one of the relaxed Si layer 33, strained SiGe layer 33 and partially strained Si layer 31 of the channel region 15a. The relaxed Si layer, strained SiGe layer and partially strained Si layer of each of the source body section 13, drain body section 14 and the second portion of each fin section 15 are doped with a high concentration of a dopant impurity and hence are each a degenerate silicon layer or a generate silicon-germanium layer. The source body section 13 and the portion of the non-channel region of each fin section 15 that connects to the source body section 13 form a source region 24, while the drain body section 14 and the portion of the non-channel region of each fin section 15 that connects to the drain body section 14 form a drain region 25. A preferable direction of crystal plane of the side surfaces of each fin section 15 is the same as in the first embodiment.

Figure 19A:
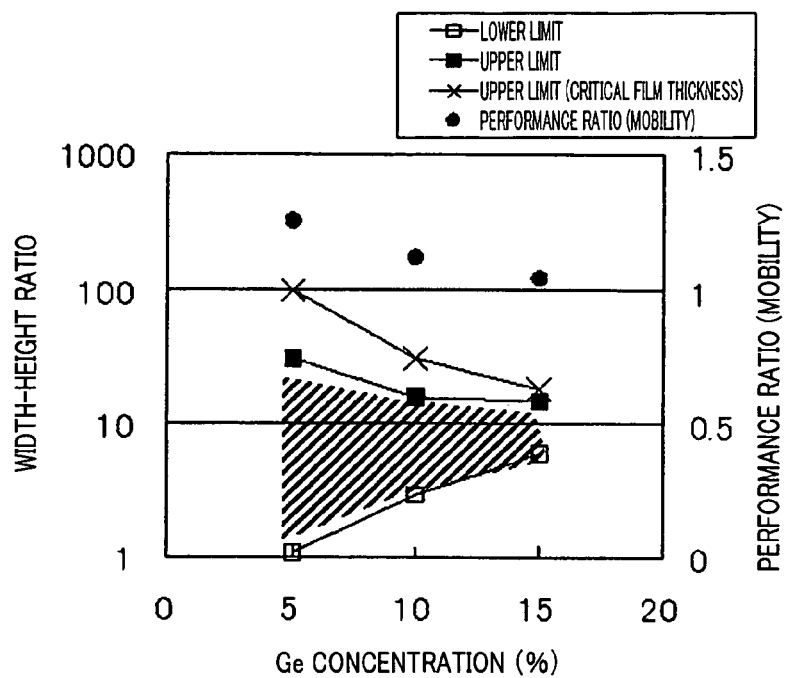
FIG. 19A is a graph plotting the dependence of an effective range of the width-height ratio of a fin section upon the Ge concentration of a stained SiGe layer in an n-channel FET.
Figure 19B:
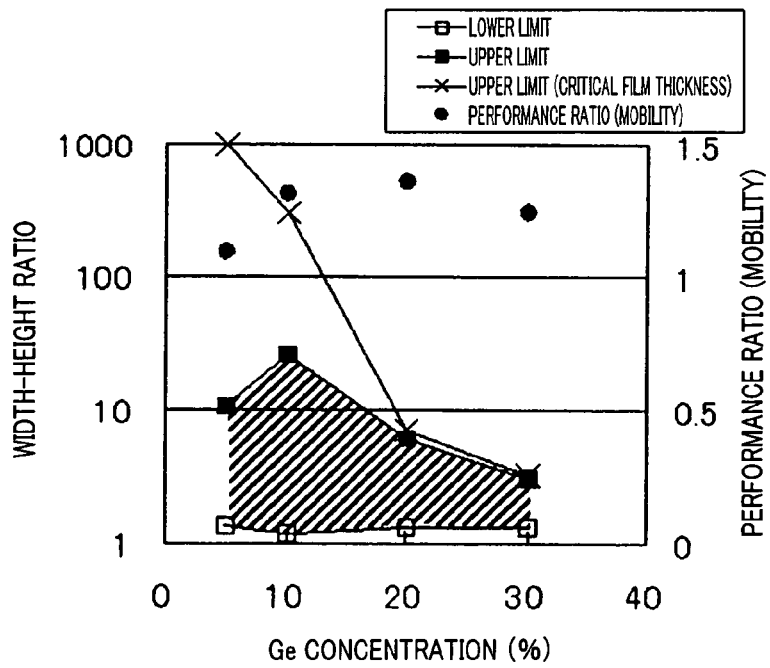
FIG. 19B is a graph plotting the dependence of an effective range of the width-height ratio of a fin section upon the Ge concentration of a stained SiGe layer in a p-channel FET.

With reference to FIGS. 19A and 19B, description will be made of a preferably range (hereinafter will be referred to as an effective range) of the ratio of the height to the width (hereinafter will be referred to as the width-height ratio) of each fin section 15. FIG. 19A is a graph plotting the dependence of effective range of the width-height ratio of a fin section upon the Ge concentration of a stained SiGe layer in an n-channel FET; and FIG. 19B is a graph plotting the dependence of effective range of the width-height ratio of a fin section upon the Ge concentration of a stained SiGe layer in a p-channel FET.

In each of FIGS. 19A and 19B, the abscissa represents the Ge concentration of the strained SiGe layer 30 and the ordinate represents the width-height ratio and the performance ratio. The "performance ratio", as used herein, means the ratio of the carrier mobility (mean value) in the FET according to the second embodiment to the carrier mobility (mean value) in the FET according to the first embodiment. Each plot marked with "x" indicates an upper limit value of the effective range of the strained SiGe layer 30. More specifically, the mark x indicates an upper limit value of the width-height ratio which is limited by a critical thickness of the strained SiGe layer 30. A lower limit value of the effective range of the strained SiGe layer 30 is 1, though not indicated by any specific mark. A plot represented by a black rectangular mark and a plot represented by a white rectangular mark indicate a more preferable upper limit value and a more preferable lower limit value, respectively, of the effective range of the width-height ratio. A plot represented by a black circle indicates a performance ratio.

As shown in FIGS. 19A and 19B, the effective range of the width-height ratio varies depending on the Ge concentration of the strained SiGe layer 30 and the polarity of channel (whether n-channel or p-channel).

Specifically, in the n-channel FET the lower limit value of preferable range of the Ge concentration of the strained Si layer is 5% as shown in FIG. 19A. This is because if the Ge concentration of the strained Si layer is less than 5%, such a strain as to sufficiently improve the carrier mobility cannot be produced in the partially strained Si layer 31. On the other hand, the upper limit value of preferable range of the Ge concentration of the strained Si layer is 15%. This is because if the Ge concentration of the strained Si layer is more than 15%, it becomes difficult to improve the performance ratio by increasing the width-height ratio due to limitation imposed by the critical thickness of the strained SiGe layer 31.

The effective range of the width-height ratio is a range defined between a curve plotting the upper limit thereof and a curve plotting the lower limit thereof within the range of the Ge concentration of the strained SiGe layer 30 from 5% to 15%. The curve plotting the upper limit of the width-height ratio is a curve linking the points (marks x) at which the width-height ratio assumes 100.00, 30.45 and 17.95, respectively while the Ge concentration assumes 5%, 10% and 15%, respectively. The curve plotting the lower limit of the width-height ratio is a straight line indicating that the width-height ratio assumes 1.0 at Ge concentrations of 5%, 10% and 15%.

The more preferable effective range of the width-height ratio is a range (hatched range) defined between the curve plotting the upper limit thereof and the curve plotting the lower limit thereof within the range of the Ge concentration of the strained SiGe layer 30 from 5% to 15%. The curve plotting the more preferable upper limit of the width-height ratio is a curve linking the points (black rectangular marks) at which the width-height ratio assumes 30.45, 15.45 and 14.95, respectively while the Ge concentration assumes 5%, 10% and 15%, respectively. The curve plotting the more preferable lower limit of the width-height ratio is a curve linking the points (white rectangular marks) at which the width-height ratio assumes 1.10, 2.95 and 5.95, respectively while the Ge concentration assumes 5%, 10% and 15%, respectively. Within this range the performance ratio is larger than 1.

In the p-channel FET the lower and upper limit values of preferable range of the Ge concentration of the strained Si layer is 5% and 30%, respectively. The grounds for the lower and upper limit values are the same as mentioned with respect to the n-channel FET.

The effective range of the width-height ratio is a range defined between a curve plotting the upper limit thereof and a curve plotting the lower limit thereof within the range of the Ge concentration of the strained SiGe layer 30 from 5% to 30%. The curve plotting the upper limit of the width-height ratio is a curve linking the points (marks x) at which the width-height ratio assumes 1000, 300, 6.95 and 3.2, respectively while the Ge concentration assumes 5%, 10%, 20% and 30%, respectively. The curve plotting the lower limit of the width-height ratio is a straight line indicating that the width-height ratio assumes 1.00 at Ge concentrations of 5%, 10%, 20% and 30%.

The more preferable effective range of the width-height ratio is a range (hatched range) defined between a curve plotting the upper limit thereof and a curve plotting the lower limit thereof within the range of the Ge concentration of the strained SiGe layer 30 from 5% to 15%. The curve plotting the more preferable upper limit of the width-height ratio is a curve linking the points (black rectangular marks) at which the width-height ratio assumes 10.45, 25.45, 5.95 and 3.00, respectively while the Ge concentration assumes 5%, 10%, 20% and 30%, respectively. The curve plotting the more preferable lower limit of the width-height ratio is a curve linking the points (white rectangular marks) at which the width-height ratio assumes 1.35, 1.15, 1.30 and 1.30, respectively while the Ge concentration assumes 5%, 10%, 20% and 30%, respectively. Within this range the performance ratio is larger than 1.

The grounds for the limit values of effective range of the width-height ratio in the n-channel and p-channel FETs are that: if the width-height ratio is lower than the lower limit, the dominance of the gate is weakened and, hence, it becomes difficult to suppress the short channel effect, thus allowing leakage current to increase; and if the width-height ratio is higher than the upper limit, the thickness of the strained Si layer 30 reaches its critical value with the result that the strained Si layer 30 becomes relaxed to form defects which cause leakage current to occur.

The grounds for the limit values of more preferable effective range of the width-height ratio are that: if the width-height ratio is not lower than the lower limit of the more preferable range, the proportion of the strained portion 31b (having a lattice strain substantially twice as large as that in the first embodiment) in the partially strained layer 31 formed on the side surfaces of the strained SiGe layer 30 becomes high, which makes the performance ratio higher than 1; and if the width-height ratio is not higher than the upper limit of the more preferable range, a performance ratio of not less than 1 is obtained while the processability and thermal stability in the fabrication of the FET are improved.

With reference to the drawings, description will be made of a method of fabricating the semiconductor device thus constructed.

Figure 12A:
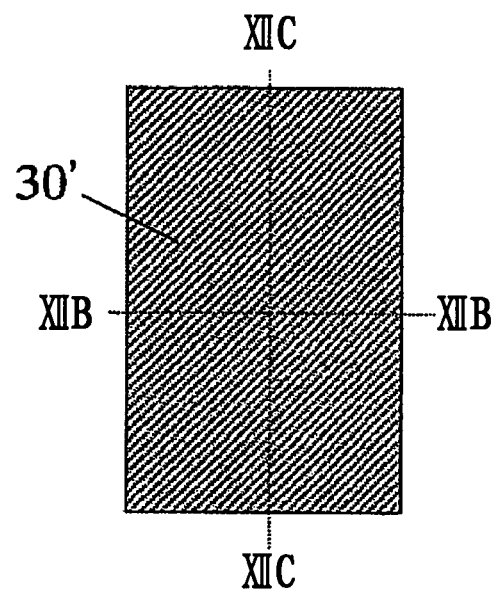
FIGS. 12A to 12C illustrate process steps of a method of fabricating the semiconductor device shown in FIG. 11; specifically.
Figure 16A:
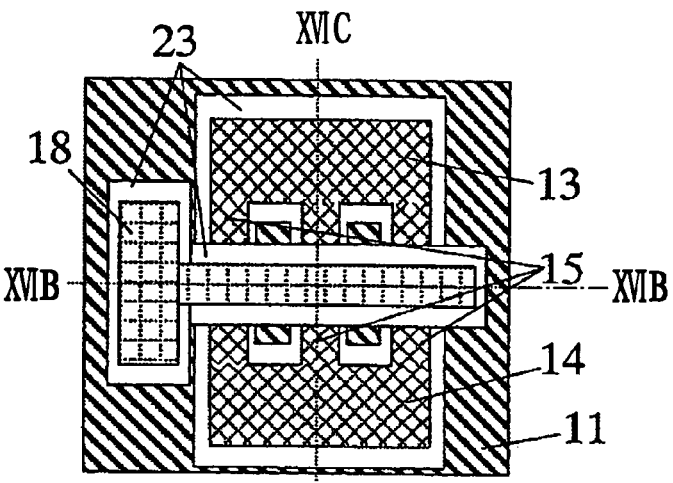
FIGS. 16A to 16C illustrate process steps of the method of fabricating the semiconductor device shown in FIG. 11; specifically.
Figure 16B:
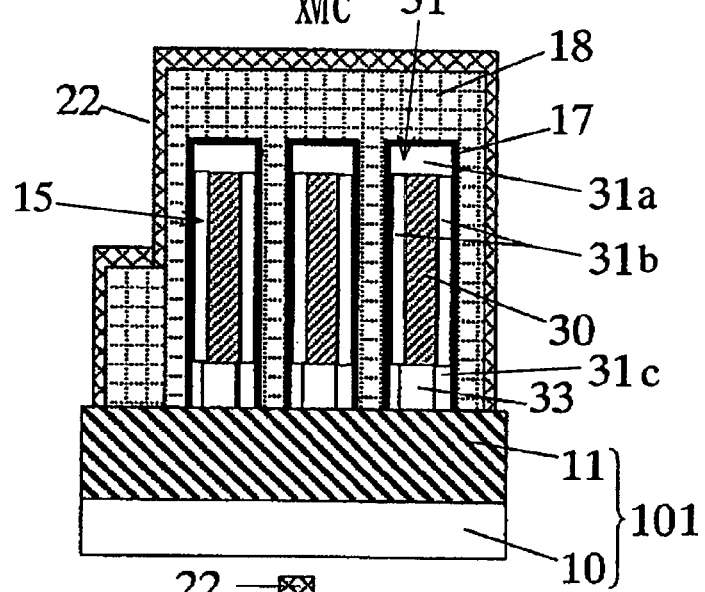
Figure 16C:
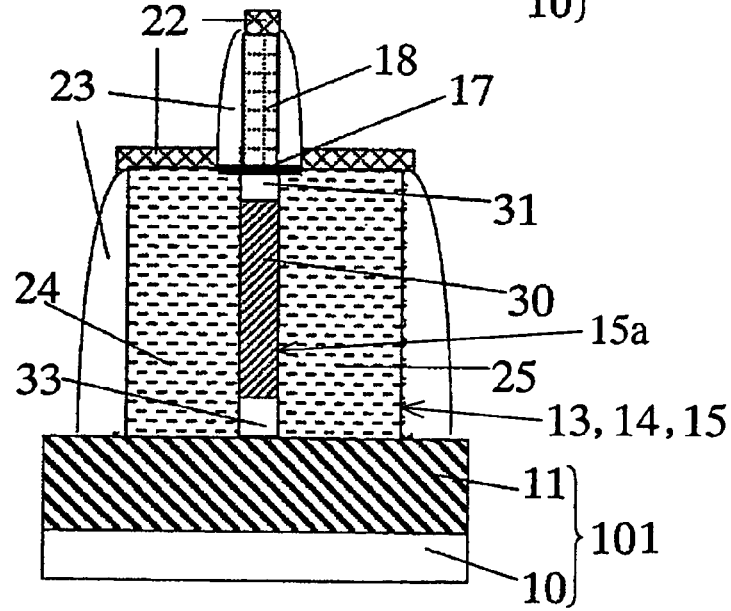

FIGS. 12A to 16C illustrate process steps of a method of fabricating the semiconductor device shown in FIG. 11. Here, FIG. 12A is a plan view and FIGS. 12B and 12C are sectional views taken on lines XIIB-XIIB and XIIC-XIIC, respectively, of FIG. 12A; FIG. 13A is a plan view and FIGS. 13B and 13C are sectional views taken on lines XIIIB-XIIIB and XIIIC-XIIIC, respectively, of FIG. 13A; FIG. 14A is a plan view and FIGS. 14B and 14C are sectional views taken on lines XIVB-XIVB and XIVC-XIVC, respectively, of FIG. 14A; FIG. 15A is a plan view and FIGS. 15B and 15C are sectional views taken on lines XVB-XVB and XVC-XVC, respectively, of FIG. 15A; and FIG. 16A is a plan view and FIGS. 16B and 16C are sectional views taken on lines XVIB-XVIB and XVIC-XVIC, respectively, of FIG. 16A. Like reference characters are used to designate like or corresponding parts throughout FIGS. 12A to 16C and FIGS. 4A to 8C.

Figure 12B:
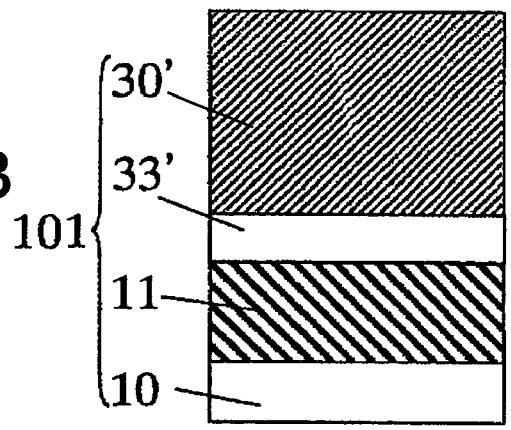
Figure 12C:
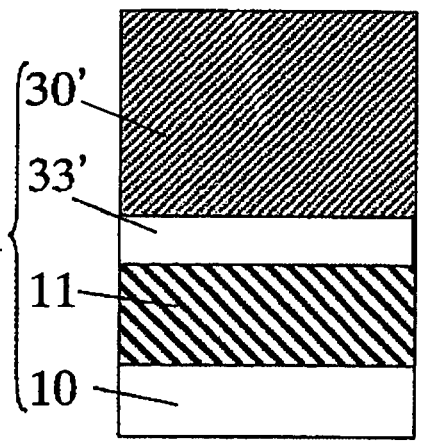

According to the present embodiment, semiconductor substrate 101 is prepared in the process illustrated in FIGS. 12A to 12C. Used as the semiconductor substrate 101 is, for example, a semiconductor substrate comprising a buried oxide film 11 (thickness: not more than substantially 400 nm), a silicon layer 33' (thickness: not more than substantially 20 nm), and a strained silicon-germanium layer 30' (germanium concentration: 10-50%, thickness: substantially 20 to 100 nm), which are formed on a silicon layer 10 in this order. The semiconductor substrate 101 can be formed in the following manner.

For example, a conventional SOI substrate is subjected to thermal oxidation and wet etching with diluted hydrofluoric acid to adjust the thickness of a surface silicon layer 33' to a desired thickness (not more than substantially 20 nm).

Subsequently, the SOI substrate is cleaned and, thereafter, a silicon-germanium layer (germanium concentration: 10-50%, thickness: substantially 20 to 100 nm) is epitaxially grown on the silicon layer 33'. In this way, there is obtained the semiconductor substrate 101 having the silicon-germanium layer 30' with a compressive strain in directions parallel with its principal surface and a tensile strain in directions perpendicular to its thicknesswise direction.

Figure 13A:
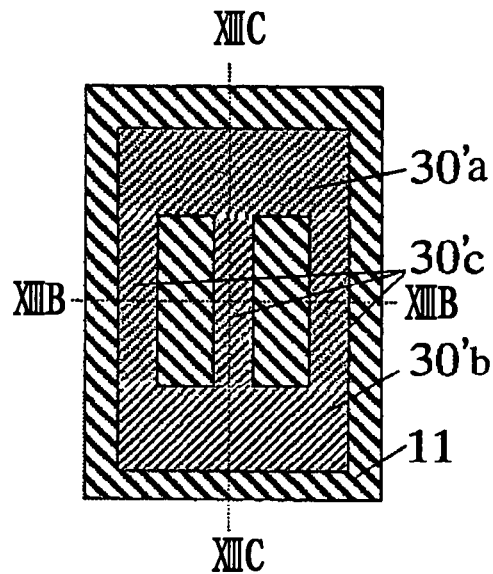
FIGS. 13A to 13C illustrate process steps of the method of fabricating the semiconductor device shown in FIG. 11; specifically.
Figure 13B:
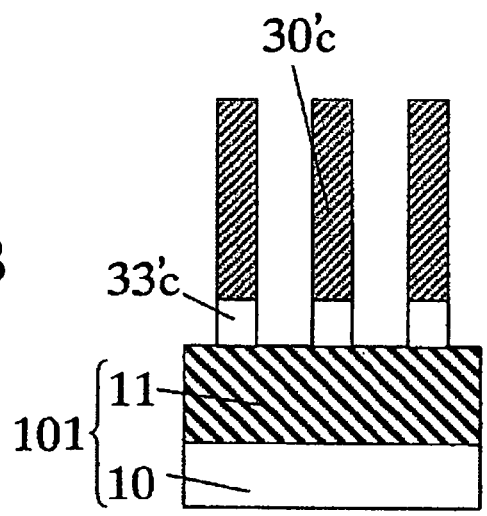
Figure 13C:
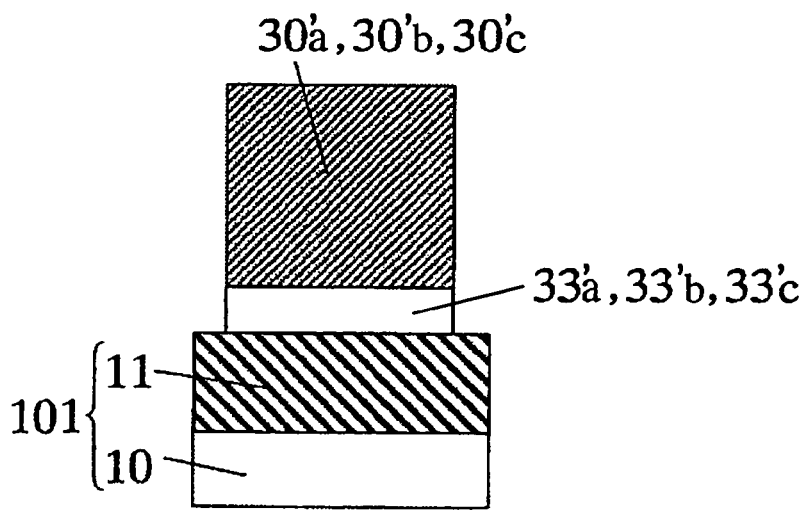

In the subsequent process steps illustrated in FIGS. 13A to 13C, firstly, a device region is defined. Specifically, the silicon layer 33' and the silicon-germanium layer 33' are subjected to dry etching with use of a patterned resist mask or a silicon oxide film deposited by plasma CVD (Chemical Vapor Deposition) or a like process as a hard mask, to form a rectangular parallelepiped section (hereinafter will be referred to as a relaxed Si/strained SiGe source body section) 33'a,30'a which will finally form the source body section 13, a rectangular parallelepiped section (hereinafter will be referred to as a relaxed Si/strained SiGe drain body section) 33'b,30'b which will finally form the drain body section 14, and three plate-shaped sections (hereinafter will be referred to as relaxed Si/strained SiGe fin sections) 33'c,30'c which will finally form the fin sections 15. Here, the relaxed Si/strained SiGe source body section 33'a,30'a and the relaxed Si/strained SiGe drain body section 33'b,30'b are formed so as to be positioned opposite to each other, while the three relaxed Si/strained SiGe fin sections 33'c,30'c formed to interconnect the relaxed Si/strained SiGe source body section 33'a,30'a and the relaxed Si/strained SiGe drain body section 33'b,30'b. In this way, the device region is defined on the substrate 101.

Figure 14A:
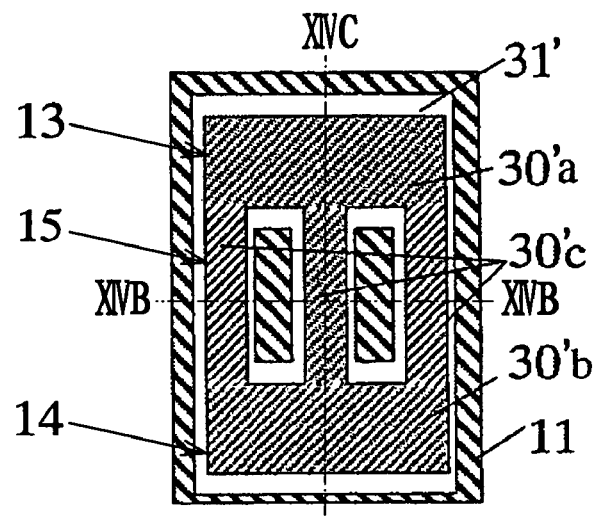
FIGS. 14A to 14C illustrate process steps of the method of fabricating the semiconductor device shown in FIG. 11; specifically.
Figure 14B:
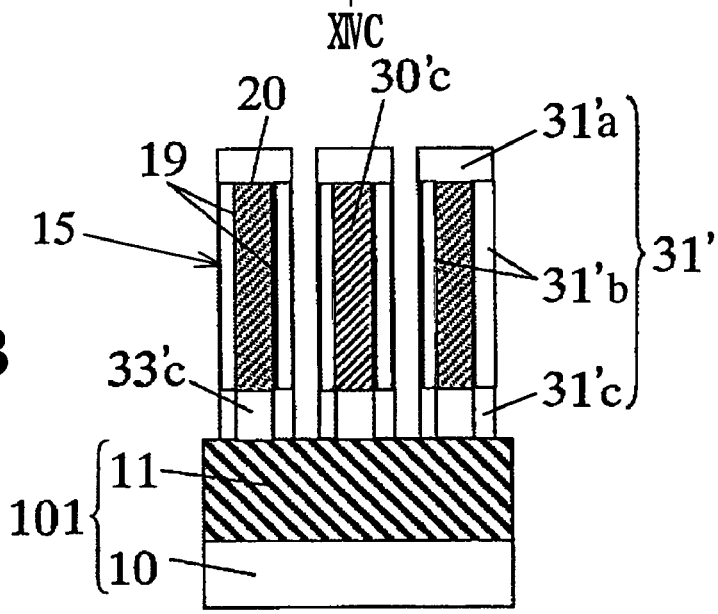
Figure 14C:
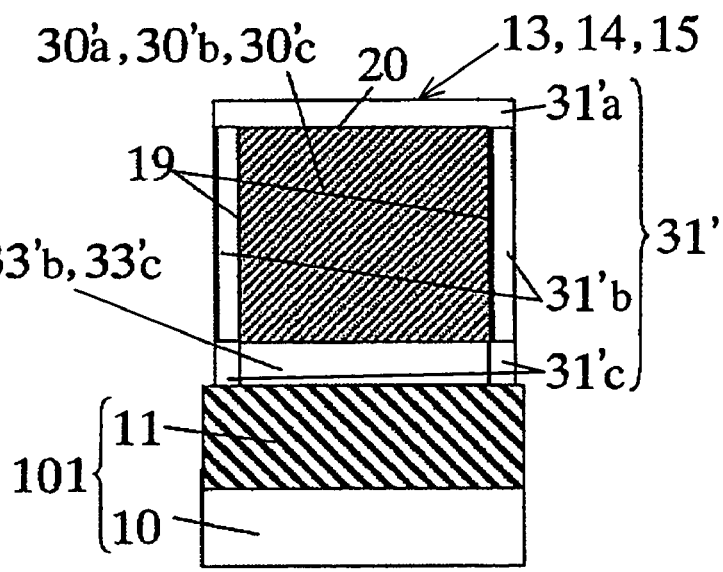
Figure 15A:
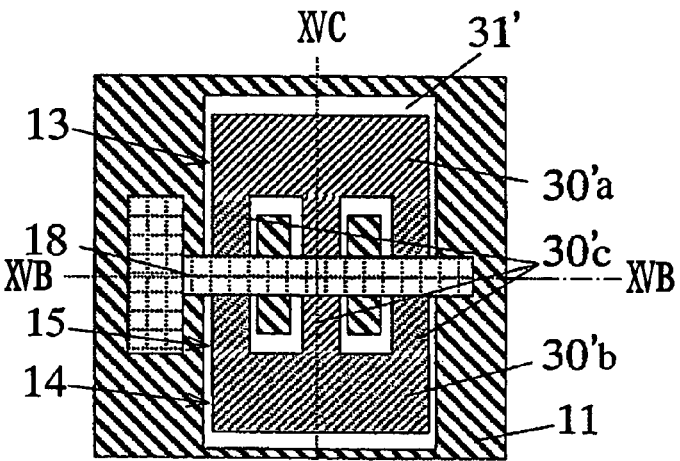
FIGS. 15A to 15C illustrate process steps of the method of fabricating the semiconductor device shown in FIG. 11; specifically.
Figure 15B:
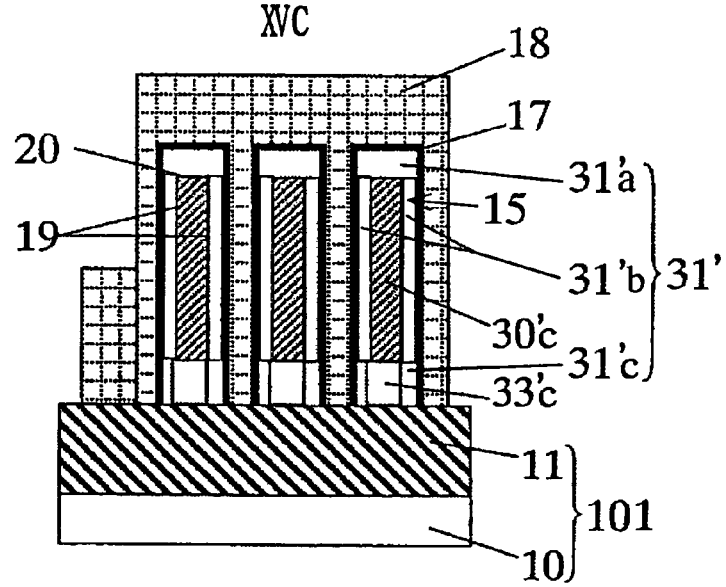
Figure 15C:
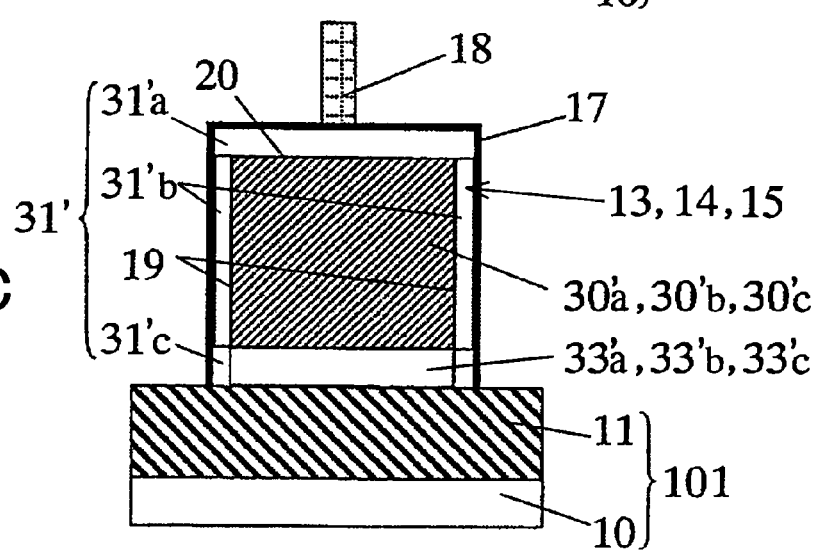

In the subsequent process steps illustrated in FIGS. 14A to 14C, a silicon film is epitaxially grown over the entire device region thus defined at a temperature of 500 to 650° C. by using UHV-CVD (Ultra High Vacuum-Chemical Vapor Deposition), to form a partially strained silicon film 31' having a tensile strain partially and a thickness of substantially 10 to substantially 50 nm. Thus, the partially strained silicon film 31' is formed to cover the top and side surfaces of respective of the relaxed Si/strained SiGe source body section 33'a,30'a, the relaxed Si/strained SiGe drain body section 33'b,30'b and the three relaxed Si/strained SiGe fin sections 33'c,30'c. As a result, the relaxed Si/strained SiGe source body section 33'a, 30'a and partially strained silicon film 31' formed over the top and side surfaces thereof form the source body section 13; the relaxed Si/strained SiGe drain body section 33'b,30'b and partially strained silicon film 31' formed over the top and side surfaces thereof form the drain body section 14; and the relaxed Si/strained SiGe fin sections 33'c,30'c and partially strained silicon film 31' formed over the top and side surfaces thereof form the fin sections 15.

The partially strained silicon layer 31' comprises a strainless portion 31'a formed on a top surface of the silicon-germanium layer 30' having a strain, a portion 31'b having a tensile strain formed on side surfaces of the silicon-germanium layer 30', and a strainless portion 31'c formed on side surfaces of the strainless silicon layer 33'.

Since the remainder of the process, i.e, the process steps illustrated in FIGS. 14A to 15C, is the same as in the first embodiment, description thereof will be omitted.

However, care should be taken of the temperature in each of the remaining process steps because the silicon-germanium layer 30' is undesirably relaxed by a high-temperature heat treatment. For example, it is desirable that: a heat treatment or the like using a common furnace be conducted at a temperature of not higher than 850° C. for a period of time as short as possible; and a rapid heat treatment or the like be conducted at a temperature of not higher than 1000° C. for a period of time as short as possible.

By performing the above-described process steps, a completed fin FET shown in FIGS. 10 and 11A to 11C can be obtained.

With reference to FIGS. 11A, 17A, 17B and 18, description will be made of the operation and effect of the semiconductor device thus constructed.

Figures 17A, 17B:
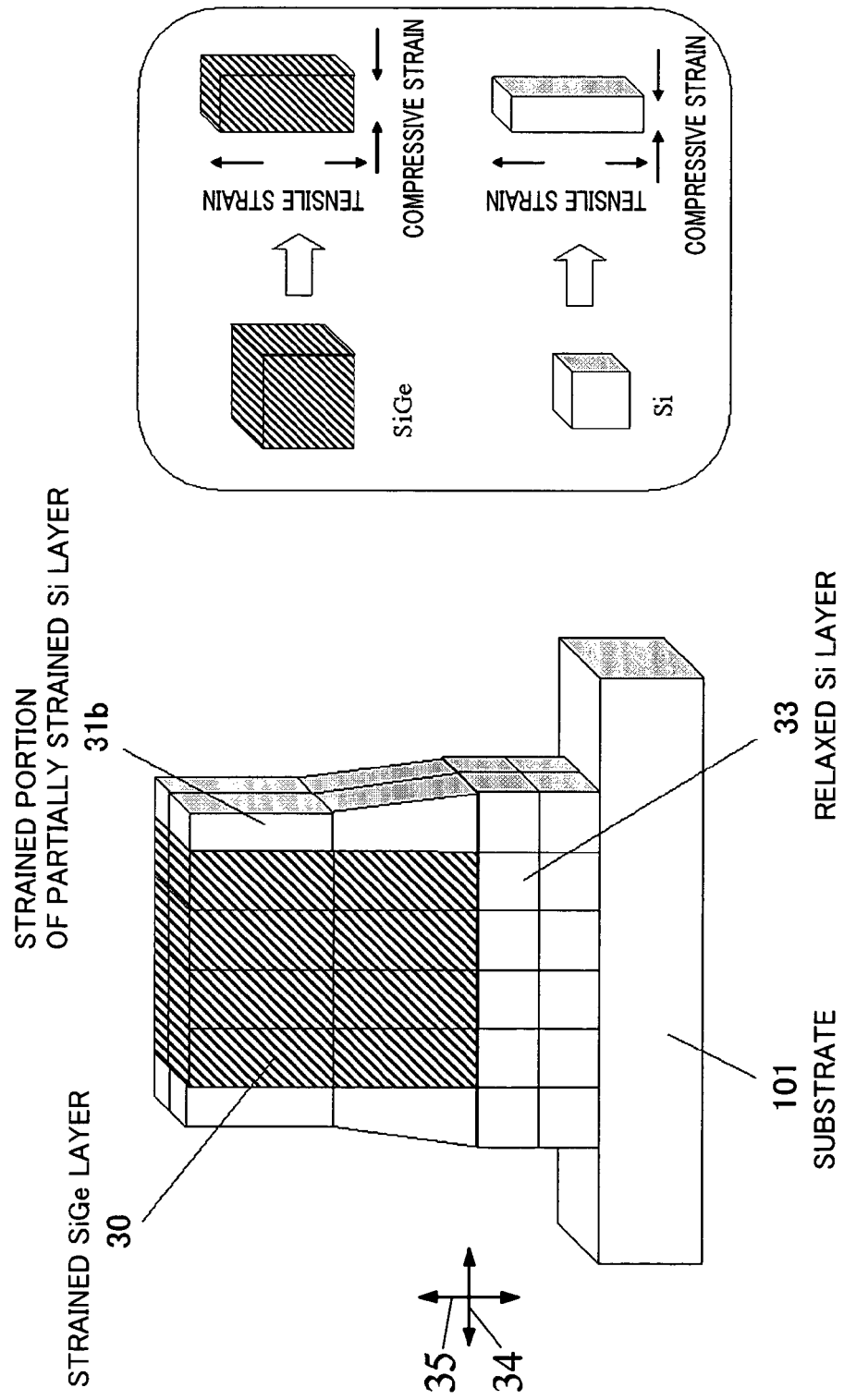
FIG. 17A is a schematic illustration showing a state of crystal lattice in a fin section of the semiconductor device according to the second embodiment.
FIG. 17B is a schematic illustration showing a strained state of crystal lattice in each of the strained SiGe layer and partially strained layer shown in FIG. 17A.

FIG. 17A is a schematic illustration showing a state of crystal lattice in the fin sections of the semiconductor device according to the second embodiment; FIG. 17B is a schematic illustration showing a strained state of crystal lattice of each of the strained SiGe layer and partially strained layer shown in FIG. 17A; and FIG. 18 is a schematic illustration showing a strained state of crystal lattice in the strained Si layer according to the first embodiment.

As shown in FIGS. 11A, 17A and 17B, in the present embodiment the partially strained Si layer 31 has a lattice strain only in the portion (strained portion) 31b formed on the side surfaces of the strained SiGe layer 30. Accordingly, only this strained portion 31b is improved in carrier mobility. The reason for this is as follows. The strained SiGe layer 30 formed on the relaxed Si layer 33 has a compressive strain in directions 34 parallel with the principal surface of the substrate 101 so as to match the lattice constant thereof with the lattice constant of silicon of the relaxed Si layer 33 and, therefore, the lattice constant of the strained SiGe layer 30 is lengthened to have a tensile strain in directions 35 perpendicular to the principal surface of the substrate 101. For this reason, the strained portion 31b of the partially strained Si layer 31 has a tensile strain produced in the directions 35 perpendicular to the principal surface of the substrate 101 so as to match the lattice constant thereof with the lengthened lattice constant of the strained SiGe layer 30, whereas the portion 31a of the partially strained Si layer 31 formed on the top surface of the strained SiGe layer 30 has no lattice strain because the portion 31a lattice-matches the relaxed Si layer 33.

Figure 18:
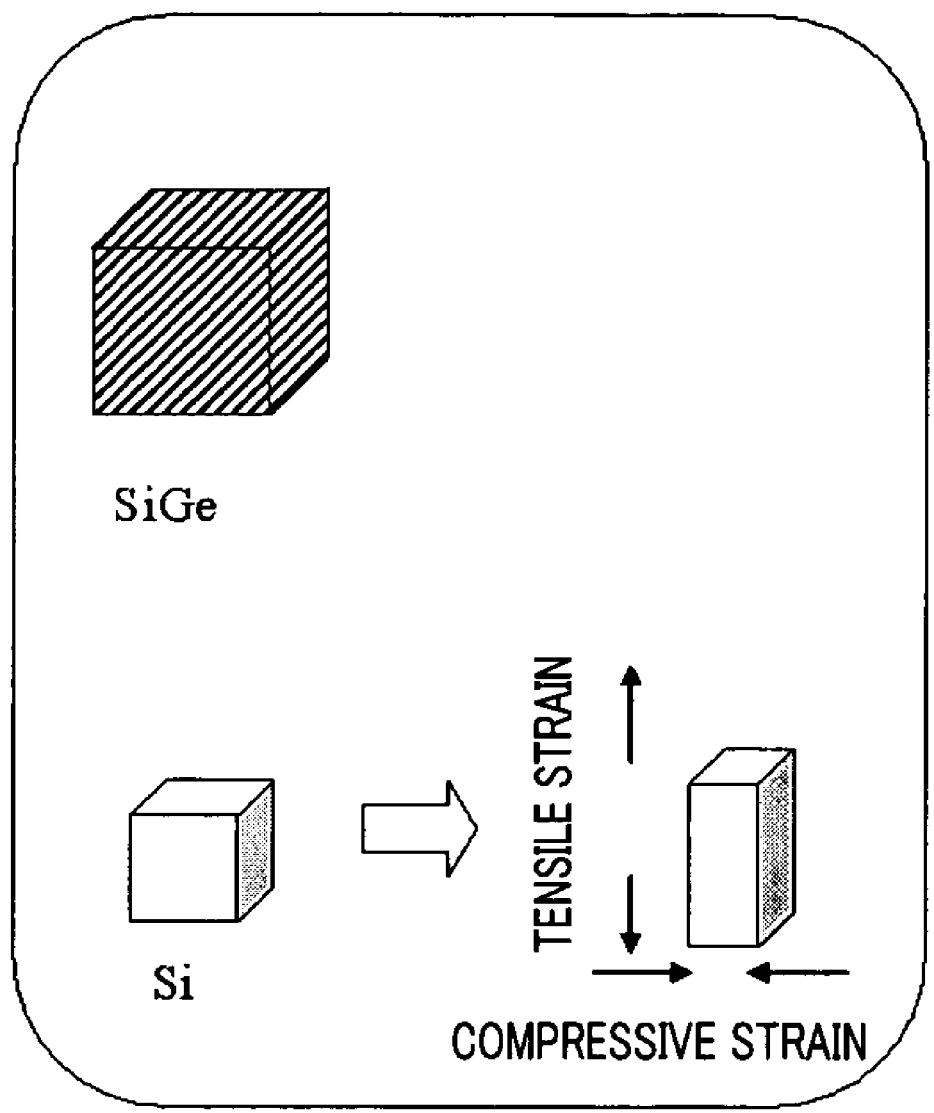
FIG. 18 is a schematic illustration showing a strained state of crystal lattice in a strained Si layer of the semiconductor device according to the first embodiment.

Meanwhile, the strained Si layer 16 according to the first embodiment also has a tensile strain as shown in FIG. 18. This tensile strain is produced to meet the lattice constant of relaxed SiGe, whereas the tensile strain of the strained portion 31b of the partially strained Si layer 31 is produced to meet the lattice constant of SiGe lengthened due to strain. Therefore, the carrier mobility of the strained portion 31b of the partially strained Si layer 31 according to the present embodiment is higher than that of the strained layer 16 according to the first embodiment since the strained portion 31b has a larger lattice strain.

As described above, in the semiconductor device according to the present embodiment, the carrier mobility is improved according to the ratio between the portion having a lattice strain (strained portion 31b) and the portion having no lattice strain (comprising the first and second relaxed portions 31a and 31c) in the partially strained layer 31 and the current driving ability is improved according to the improvement in carrier mobility. Therefore, if the ratio of the portion having a lattice strain to the portion having no lattice strain in the partially strained layer 31 exceeds a certain value, the semiconductor device according to the present embodiment is expected to have higher carrier mobility and higher current driving ability than the semiconductor device according to the first embodiment.

Further, the semiconductor device according to the present embodiment is superior to the semiconductor device according to the first embodiment in easy-to-fabricate characteristic. This is because the present embodiment uses semiconductor substrate 101 comprising a conventional SOI substrate provided with strained silicon-germanium layer 30' thereon and does not need to use a SGOI substrate having relaxed silicon-germanium layer 12' on an insulating film, the SGOI substrate being relatively difficult to prepare.

SECOND EXAMPLE

Hereinafter, a semiconductor device and a fabrication method thereof according to a second example will be described with reference to FIGS. 12A to 16C.

According to the present example, a semiconductor substrate 101 is prepared in the process illustrated in FIGS. 12A to 12C. Used as the semiconductor substrate 101 is, for example, a semiconductor substrate comprising a buried oxide film 11 (thickness: not more than substantially 400 nm), a silicon layer 33' (thickness: substantially 10 nm), and a strained silicon-germanium layer 30' (germanium concentration: substantially 30%, thickness: substantially 100 nm), which are formed on a silicon layer 10 in this order. The semiconductor substrate 101 is formed in the following manner.

For example, a conventional SOI substrate is subjected to thermal oxidation and wet etching with diluted hydrofluoric acid to adjust the thickness of a surface silicon layer 33' to a desired thickness (substantially 10 nm).

Subsequently, the SOI substrate is cleaned and, thereafter, a silicon-germanium layer (germanium concentration: 30%, thickness: substantially 100 nm) is epitaxially grown on the silicon layer 33'. In this way, there is obtained the semiconductor substrate 101 having the silicon-germanium layer 30' with a compressive strain in directions parallel with its principal surface and a tensile strain in directions perpendicular to its thicknesswise direction.

The remainder of the process is performed in the same manner as in the first example to complete an n-channel transistor as shown in FIGS. 10 and 11A to 11C.

Since the strained silicon film 31 having a strain in one direction is formed on the side surfaces of the strained silicon-germanium layer 30, the n-channel FET fabricated according to the second example enjoys enhanced effective electron mobility and hence has improved current driving ability. Further, the structure wherein the three-dimensional channel structure comprising the partially strained Si layer 31 formed over the top and side surfaces of the strained silicon-germanium layer 30 is surrounded by the gate electrode 18 as shown in FIG. 11A, enhances the dominance of the gate over the channel thereby ensuring a high current driving ability even at a low voltage while suppressing the short channel effect. For this reason, the n-channel FET according to the second example is a device suited to miniaturization.

While the present example is directed to the construction and fabrication method of the n-channel FET, a p-channel FET construction and a fabrication method thereof can be obtained similarly by using a dopant impurity of opposite polarity. Further, it is possible to obtain a complementary FET using such n-channel transistor and p-channel transistor.

While the source body section 13 and the drain body section 14 are each formed into a rectangular parallelepiped shape in each of the first and second embodiments, it is sufficient for these sections to be island-shaped.

While the fin sections 15 interconnecting the source body section 13 and the drain body section 14 are plate-shaped, it is sufficient for the fin sections 15 to be ridge-shaped.

It will be apparent from the foregoing description that many improvements and other embodiments of the present invention may occur to those skilled in the art. Therefore, the foregoing description should be construed as an illustration only and is provided for the purpose of teaching the best mode for carrying out the present invention to those skilled in the art. The details of the structure and/or the function of the present invention can be modified substantially without departing from the spirit of the present invention.

INDUSTRIAL APPLICABILITY

The semiconductor device according to the present invention is useful as a fin FET having improved current driving ability.

The method of fabricating a semiconductor device according to the present invention is useful as a method of fabricating a fin FET having improved current driving ability.

The invention claimed is:

1. A semiconductor device comprising:
   a first insulating layer;
   a first body section comprising an island: shaped semiconductor formed on the first insulating layer;
   a second body section comprising an island-shaped semiconductor formed on the first insulating layer;
   a ridge-shaped connecting section formed on the first insulating layer to interconnect the first body section and the second body section;
   a channel region comprising at least a part of the connecting section in lengthwise direction of the connecting section;
   a gate electrode formed to cover a periphery of the channel region, with a second insulating layer intervening therebetween;
   a source region formed to extend over the first body section and a portion of the connecting section between the first body section and the channel region; and
   a drain region formed to extend over the second body section and a portion of the connecting section between the second body section and the channel region,
   wherein the channel region comprises: a stacked structure comprising a relaxed semiconductor layer which is formed on the first insulating layer and whose lattice is relaxed, and a strained semiconductor layer which is formed on the relaxed semiconductor layer to lattice-match the relaxed semiconductor layer; and a partially strained semiconductor layer which is formed to lattice-match a side surface of the relaxed semiconductor layer and side and top surfaces of the strained semiconductor layer, so as to cover side and top surfaces of the stacked structure; and
   wherein the strained semiconductor layer comprises a first type of semiconductor, and each of the relaxed semiconductor layer and the partially relaxed semiconductor layer comprises a second type of semiconductor having a smaller lattice constant than the first type of semiconductor.

2. The semiconductor device according to claim 1, wherein the strained semiconductor layer has a germanium concentration of not less than 5% and not more than 15% when the channel region is configured to form an n-channel, and a germanium concentration of not less than 5% and not more than 30% when the channel region is configured to form a p-channel.

3. The semiconductor device according to claim 2, wherein the connecting section has a rectangular profile and has a height-to-width ratio of not less than 1 and not more than 100 when the channel region is configured to form an n-channel, and a height-to-width ratio of not less than 1 and not more than 1000 when the channel region is configured to form a p-channel.

4. The semiconductor device according to claim 3, wherein the connecting section has a height-to-width ratio of not less than 1.1. and not more than 30.45 when the channel region is configured to form an n-channel, and a height-to-width ratio of not less than 1.15 and not more than 25.45 when the channel region is configured to form a p-channel.

* * * * *